United States Patent
Kim et al.

(10) Patent No.: US 12,156,406 B2
(45) Date of Patent: Nov. 26, 2024

(54) METHODS OF FORMING INTEGRATED ASSEMBLIES WITH IMPROVED CHARGE MIGRATION IMPEDANCE

(71) Applicant: Lodestar Licensing Group LLC, Evanston, IL (US)

(72) Inventors: Byeung Chul Kim, Boise, ID (US); Shyam Surthi, Boise, ID (US)

(*) Notice: Subject to any disclaimer, the term of this patent is extended or adjusted under 35 U.S.C. 154(b) by 540 days.

(21) Appl. No.: 17/501,951

(22) Filed: Oct. 14, 2021

(65) Prior Publication Data
US 2022/0037357 A1 Feb. 3, 2022

Related U.S. Application Data

(62) Division of application No. 16/681,200, filed on Nov. 12, 2019, now Pat. No. 11,171,153.

(51) Int. Cl.
| | |
|---|---|
| H10B 43/27 | (2023.01) |
| H10B 43/10 | (2023.01) |
| H10B 43/35 | (2023.01) |

(52) U.S. Cl.
CPC .......... H10B 43/27 (2023.02); H10B 43/10 (2023.02); H10B 43/35 (2023.02)

(58) Field of Classification Search
CPC ........ H10B 69/00; H10B 53/00; H10B 53/10; H10B 53/20; H10B 53/30; H10B 53/40; H10B 53/50; H10B 41/00; H10B 41/10; H10B 41/20; H10B 41/23; H10B 41/27; H10B 41/30; H10B 41/35; H10B 41/40–44; H10B 41/46–50;
(Continued)

(56) References Cited

U.S. PATENT DOCUMENTS 9,773,882 B1 9/2017 Lee
10,777,576 B1* 9/2020 Kim .................. G11C 16/0483
(Continued)

FOREIGN PATENT DOCUMENTS

| CN | 101872788 | 10/2010 |
|---|---|---|
| EP | 20887839 | 12/2022 |

(Continued)

*Primary Examiner* — Didarul A Mazumder
*Assistant Examiner* — Gustavo G Ramallo
(74) *Attorney, Agent, or Firm* — Brooks, Cameron & Huebsch, PLLC

(57) ABSTRACT

Some embodiments include a memory device having a vertical stack of alternating insulative levels and conductive levels. Memory cells are along the conductive levels. The conductive levels have control gate regions which include a first vertical thickness, have routing regions which include a second vertical thickness that is less than the first vertical thickness, and have tapered transition regions between the first vertical thickness and the second vertical thickness. Charge-blocking material is adjacent to the control gate regions. Charge-storage material is adjacent to the charge-blocking material. Dielectric material is adjacent to the charge-storage material. Channel material extends vertically along the vertical stack and is adjacent to the dielectric material. The memory cells include the control gate regions, and include regions of the charge-blocking material, the charge-storage material, the dielectric material and the channel material. Some embodiments include methods of forming integrated assemblies.

20 Claims, 20 Drawing Sheets

(58) Field of Classification Search
CPC ........ H10B 41/60; H10B 41/70; H10B 43/00;
H10B 43/10; H10B 43/20; H10B 43/23;
H10B 43/27; H10B 43/30; H10B 43/35;
H10B 43/40; H10B 43/50; H10B 51/00;
H10B 51/10; H10B 51/20; H10B 51/30;
H10B 51/40; H10B 51/50
See application file for complete search history.

(56) References Cited

U.S. PATENT DOCUMENTS

| | | | |
|---|---|---|---|
| 2010/0270593 A1 | 10/2010 | Lung et al. | |
| 2011/0287612 A1 | 11/2011 | Lee et al. | |
| 2015/0060993 A1 | 3/2015 | Lee et al. | |
| 2015/0123189 A1 | 5/2015 | Sun et al. | |
| 2015/0294980 A1 | 10/2015 | Lee et al. | |
| 2015/0333186 A1* | 11/2015 | Yoo | H01L 29/7926 257/324 |
| 2015/0380422 A1 | 12/2015 | Sharangpani et al. | |
| 2015/0380424 A1 | 12/2015 | Makala et al. | |
| 2016/0351582 A1* | 12/2016 | Kim | H10B 43/35 |
| 2017/0062460 A1 | 3/2017 | Nishida et al. | |
| 2017/0243879 A1 | 8/2017 | Yu et al. | |
| 2018/0040627 A1* | 2/2018 | Kanakamedala | H10B 41/27 |
| 2018/0219021 A1 | 8/2018 | Daycock et al. | |
| 2018/0286883 A1 | 10/2018 | Hopkins et al. | |
| 2019/0198510 A1 | 6/2019 | Kim | |
| 2019/0267396 A1 | 8/2019 | Daycock et al. | |
| 2019/0312052 A1* | 10/2019 | Lee | H10B 43/35 |
| 2021/0143171 A1* | 5/2021 | Kim | H10B 43/35 |

FOREIGN PATENT DOCUMENTS

| | | |
|---|---|---|
| TW | 109135440 | 10/2021 |
| WO | WO PCT/US2020/052030 | 1/2021 |

* cited by examiner

METHODS OF FORMING INTEGRATED ASSEMBLIES WITH IMPROVED CHARGE MIGRATION IMPEDANCE

RELATED PATENT DATA

This patent resulted from a divisional of U.S. patent application Ser. No. 16/681,200 filed Nov. 12, 2019, which is hereby incorporated by reference herein.

TECHNICAL FIELD

Integrated assemblies (e.g., memory devices) and methods of forming integrated assemblies.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory, and may be configured to comprise vertically-stacked memory cells.

Before describing NAND specifically, it may be helpful to more generally describe the relationship of a memory array within an integrated arrangement. FIG. 1 shows a block diagram of a prior art device 1000 which includes a memory array 1002 having a plurality of memory cells 1003 arranged in rows and columns along with access lines 1004 (e.g., wordlines to conduct signals WL0 through WLm) and first data lines 1006 (e.g., bitlines to conduct signals BL0 through BLn). Access lines 1004 and first data lines 1006 may be used to transfer information to and from the memory cells 1003. A row decoder 1007 and a column decoder 1008 decode address signals A0 through AX on address lines 1009 to determine which ones of the memory cells 1003 are to be accessed. A sense amplifier circuit 1015 operates to determine the values of information read from the memory cells 1003. An I/O circuit 1017 transfers values of information between the memory array 1002 and input/output (I/O) lines 1005. Signals DQ0 through DQN on the I/O lines 1005 can represent values of information read from or to be written into the memory cells 1003. Other devices can communicate with the device 1000 through the I/O lines 1005, the address lines 1009, or the control lines 1020. A memory control unit 1018 is used to control memory operations to be performed on the memory cells 1003, and utilizes signals on the control lines 1020. The device 1000 can receive supply voltage signals Vcc and Vss on a first supply line 1030 and a second supply line 1032, respectively. The device 1000 includes a select circuit 1040 and an input/output (I/O) circuit 1017. The select circuit 1040 can respond, via the I/O circuit 1017, to signals CSEL1 through CSELn to select signals on the first data lines 1006 and the second data lines 1013 that can represent the values of information to be read from or to be programmed into the memory cells 1003. The column decoder 1008 can selectively activate the CSEL1 through CSELn signals based on the A0 through AX address signals on the address lines 1009. The select circuit 1040 can select the signals on the first data lines 1006 and the second data lines 1013 to provide communication between the memory array 1002 and the I/O circuit 1017 during read and programming operations.

The memory array 1002 of FIG. 1 may be a NAND memory array, and FIG. 2 shows a schematic diagram of a three-dimensional NAND memory device 200 which may be utilized for the memory array 1002 of FIG. 1. The device 200 comprises a plurality of strings of charge-storage devices. In a first direction (Z-Z'), each string of charge-storage devices may comprise, for example, thirty-two charge-storage devices stacked over one another with each charge-storage device corresponding to one of, for example, thirty-two tiers (e.g., Tier0-Tier31). The charge-storage devices of a respective string may share a common channel region, such as one formed in a respective pillar of semiconductor material (e.g., polysilicon) about which the string of charge-storage devices is formed. In a second direction (X-X'), each first group of, for example, sixteen first groups of the plurality of strings may comprise, for example, eight strings sharing a plurality (e.g., thirty-two) of access lines (i.e., "global control gate (CG) lines", also known as wordlines, WLs). Each of the access lines may couple the charge-storage devices within a tier. The charge-storage devices coupled by the same access line (and thus corresponding to the same tier) may be logically grouped into, for example, two pages, such as P0/P32, P1/P33, P2/P34 and so on, when each charge-storage device comprises a cell capable of storing two bits of information. In a third direction (Y-Y'), each second group of, for example, eight second groups of the plurality of strings, may comprise sixteen strings coupled by a corresponding one of eight data lines. The size of a memory block may comprise 1,024 pages and total about 16 MB (e.g., 16 WLs×32 tiers×2 bits=1,024 pages/block, block size=1,024 pages×16 KB/page=16MB). The number of the strings, tiers, access lines, data lines, first groups, second groups and/or pages may be greater or smaller than those shown in FIG. 2.

FIG. 3 shows a cross-sectional view of a memory block 300 of the 3D NAND memory device 200 of FIG. 2 in an X-X' direction, including fifteen strings of charge-storage devices in one of the sixteen first groups of strings described with respect to FIG. 2. The plurality of strings of the memory block 300 may be grouped into a plurality of subsets 310, 320, 330 (e.g., tile columns), such as tile column$_I$, tile column$_j$ and tile column$_K$, with each subset (e.g., tile column) comprising a "partial block" of the memory block 300. A global drain-side select gate (SGD) line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332, 334, 336 may concurrently couple or cut off the SGDs of the strings of a corresponding partial block (e.g., tile column) independently of those of other partial blocks. A global source-side select gate (SGS) line 360 may be coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SGS drivers 322, 324, 326 may concurrently couple or cut off the SGSs of the strings of a corresponding partial block (e.g., tile column) independently of those of other partial blocks. A global access line (e.g., a global CG line) 350 may couple the charge-storage devices corresponding to the respective tier of each of the plurality of strings. Each global CG line (e.g., the global CG line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge-storage devices corresponding to the respective partial block and/or tier independently of those of other partial blocks and/or other tiers. The charge-storage devices corresponding to the respective subset (e.g., partial block) and the respective tier may comprise a "partial tier" (e.g., a single "tile") of charge-storage devices. The strings corresponding to the respective subset (e.g., partial block) may be coupled to a corresponding one of sub-sources 372, 374 and 376 (e.g., "tile source") with each sub-source being coupled to a respective power source.

The NAND memory device 200 is alternatively described with reference to a schematic illustration of FIG. 4.

The memory array 200 includes wordlines $202_1$ to $202_N$, and bitlines $228_1$ to $228_M$.

The memory array 200 also includes NAND strings $206_1$ to $206_M$. Each NAND string includes charge-storage transistors $208_1$ to $208_N$. The charge-storage transistors may use floating gate material (e.g., polysilicon) to store charge, or may use charge-trapping material (such as, for example, silicon nitride, metallic nanodots, etc.) to store charge.

The charge-storage transistors 208 are located at intersections of wordlines 202 and strings 206. The charge-storage transistors 208 represent non-volatile memory cells for storage of data. The charge-storage transistors 208 of each NAND string 206 are connected in series source-to-drain between a source-select device (e.g., source-side select gate, SGS) 210 and a drain-select device (e.g., drain-side select gate, SGD) 212. Each source-select device 210 is located at an intersection of a string 206 and a source-select line 214, while each drain-select device 212 is located at an intersection of a string 206 and a drain-select line 215. The select devices 210 and 212 may be any suitable access devices, and are generically illustrated with boxes in FIG. 4.

A source of each source-select device 210 is connected to a common source line 216. The drain of each source-select device 210 is connected to the source of the first charge-storage transistor 208 of the corresponding NAND string 206. For example, the drain of source-select device $210_1$ is connected to the source of charge-storage transistor $208_1$ of the corresponding NAND string $206_1$. The source-select devices 210 are connected to source-select line 214.

The drain of each drain-select device 212 is connected to a bitline (i.e., digit line) 228 at a drain contact. For example, the drain of drain-select device $212_1$ is connected to the bitline $228_1$. The source of each drain-select device 212 is connected to the drain of the last charge-storage transistor 208 of the corresponding NAND string 206. For example, the source of drain-select device $212_1$ is connected to the drain of charge-storage transistor $208_N$ of the corresponding NAND string $206_1$.

The charge-storage transistors 208 include a source 230, a drain 232, a charge-storage region 234, and a control gate 236. The charge-storage transistors 208 have their control gates 236 coupled to a wordline 202. A column of the charge-storage transistors 208 are those transistors within a NAND string 206 coupled to a given bitline 228. A row of the charge-storage transistors 208 are those transistors commonly coupled to a given wordline 202.

It is desired to develop improved NAND architecture and improved methods for fabricating NAND architecture.

DETAILED DESCRIPTION OF THE ILLUSTRATED EMBODIMENTS

Operation of memory cells may comprise movement of charge between a channel material and a charge-storage material. For instance, programming of a memory cell may comprise moving charge (i.e., electrons) from the channel material into the charge-storage material, and then storing the charge within the charge-storage material. Erasing of the memory cell may comprise moving holes into the charge-storage material to recombine with the electrons stored in the charge-storage material, and to thereby release charge from the charge-storage material. The charge-storage material may comprise charge-trapping material (for instance, silicon nitride, metal nanodots, etc.). A problem with conventional memory can be that charge-trapping material extends across multiple memory cells of a memory array, and such can lead to charge migration from one memory cell to another. The charge migration may lead to data retention problems. Some embodiments include memory devices (e.g., NAND architectures) having breaks in the charge-trapping material in regions between memory cells; and such breaks may advantageously impede migration of charge between memory cells.

Another problem which may be encountered with conventional memory cells is that control gates may be too narrow to achieve desired rapid programming and erase of memory cells. Some embodiments include memory devices with relative wide control gates which are tailored to provide wider program/erase windows than are generally available with conventional architectures. The wide control gates may be formed in combination with narrow routing structures (wordlines) which are tailored to reduce undesired parasitic capacitance between vertically-stacked routing structures. Example embodiments are described with reference to FIGS. 5-19.

Figure 1:
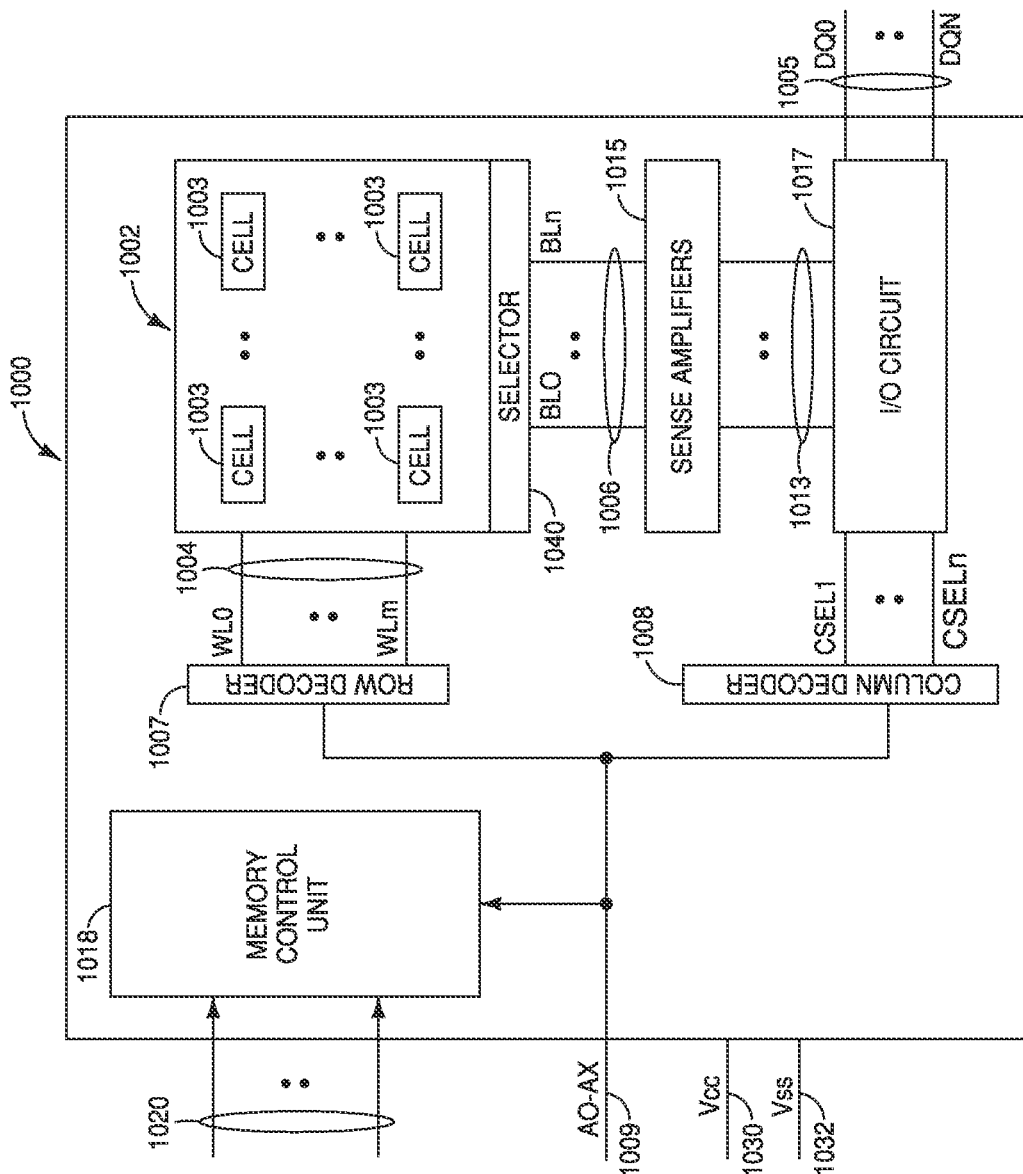
FIG. 1 shows a block diagram of a prior art memory device having a memory array with memory cells.
Figure 2:
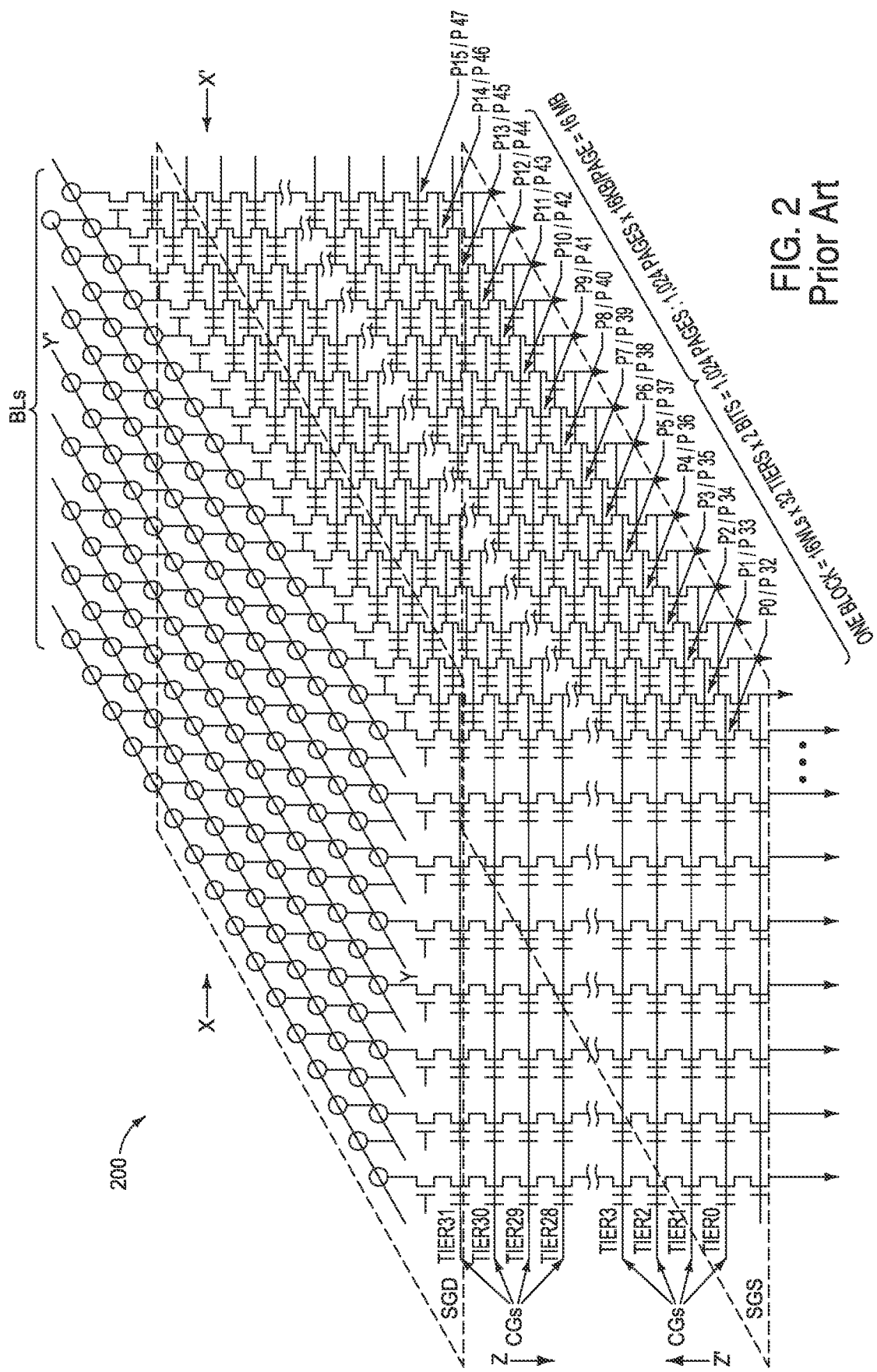
FIG. 2 shows a schematic diagram of the prior art memory array of FIG. 1 in the form of a 3D NAND memory device.
Figure 3:
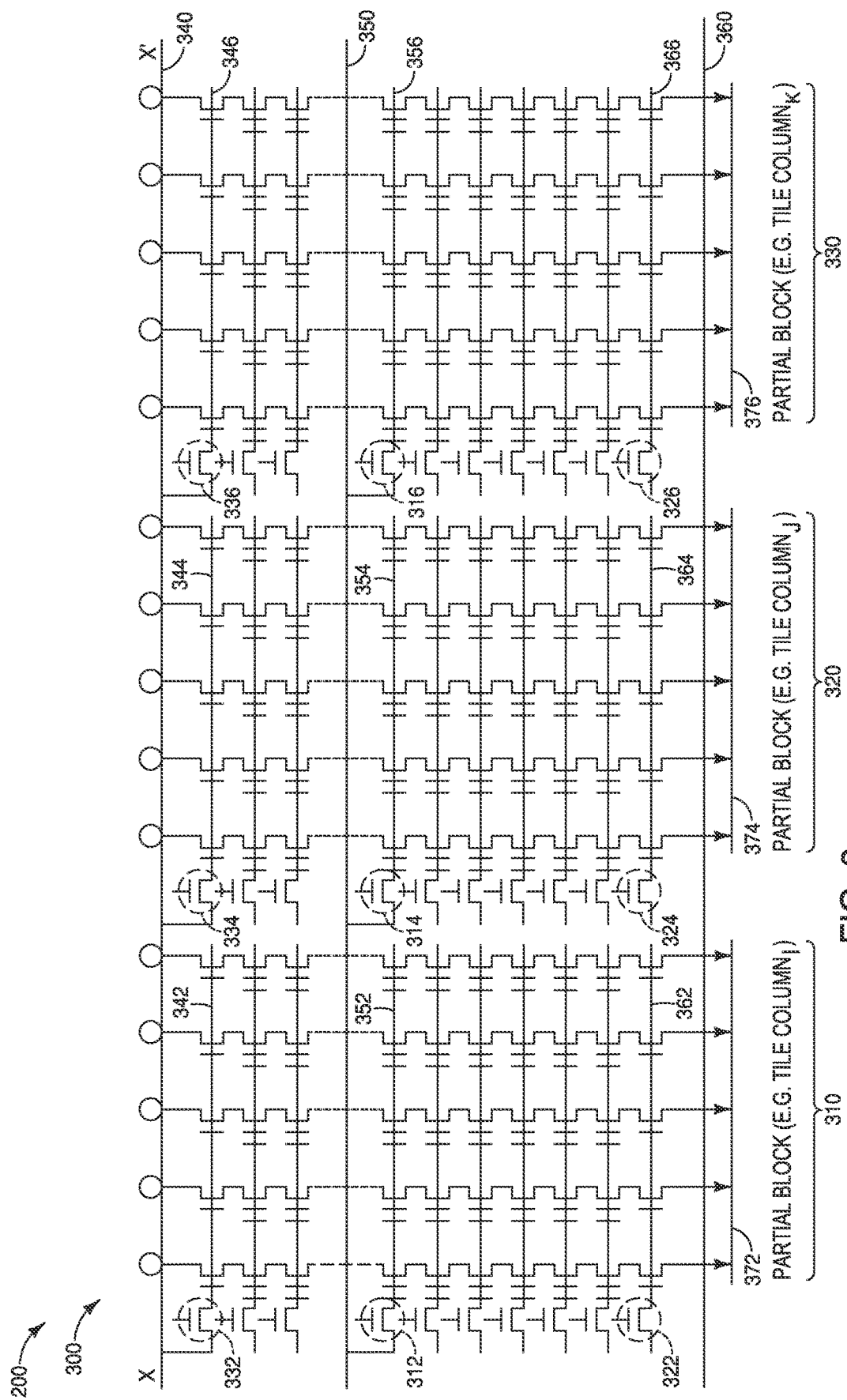
FIG. 3 shows a cross-sectional view of the prior art 3D NAND memory device of FIG. 2 in an X-X' direction.
Figure 4:
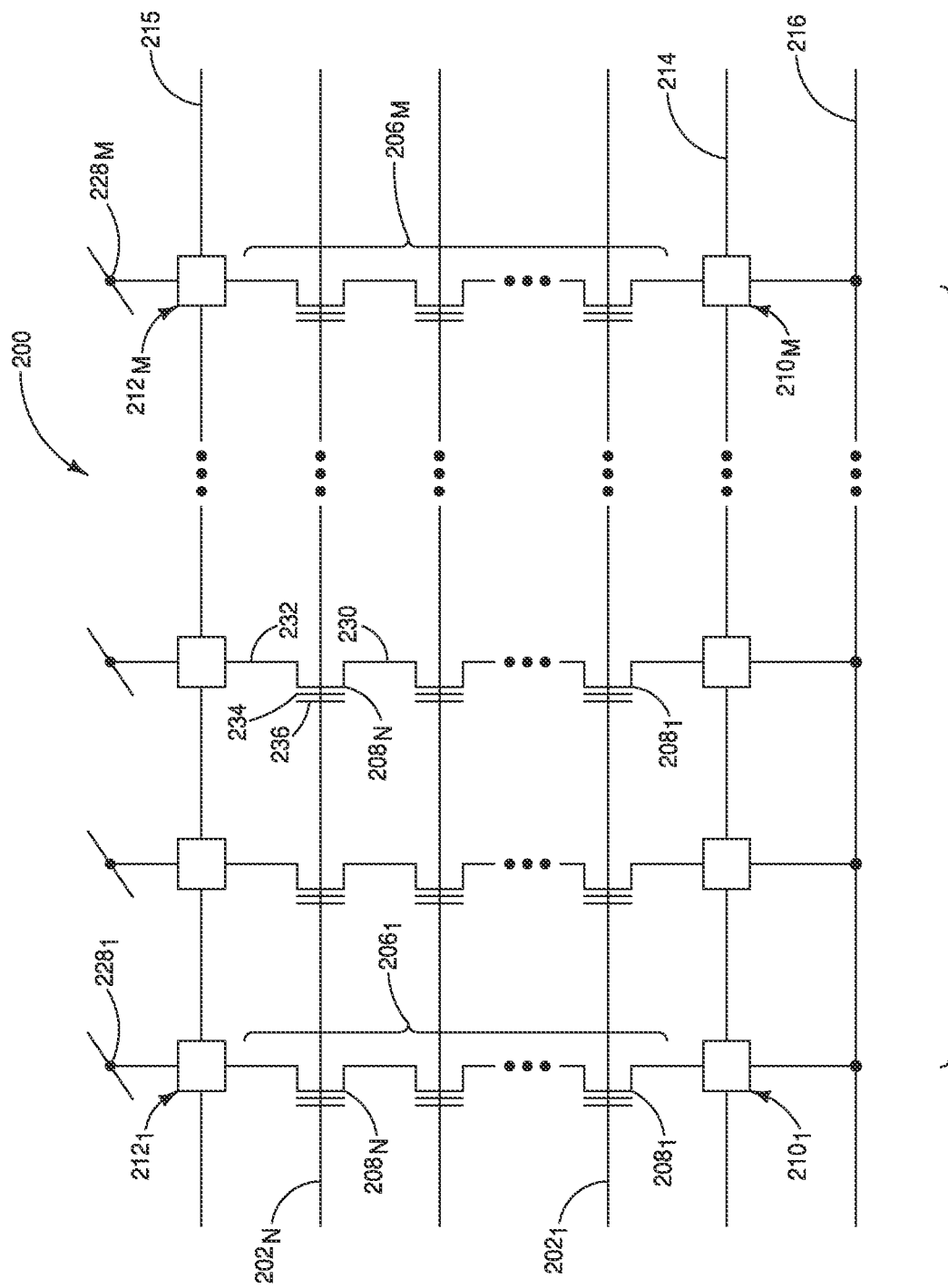
FIG. 4 is a schematic diagram of a prior art NAND memory array.
Figure 5:
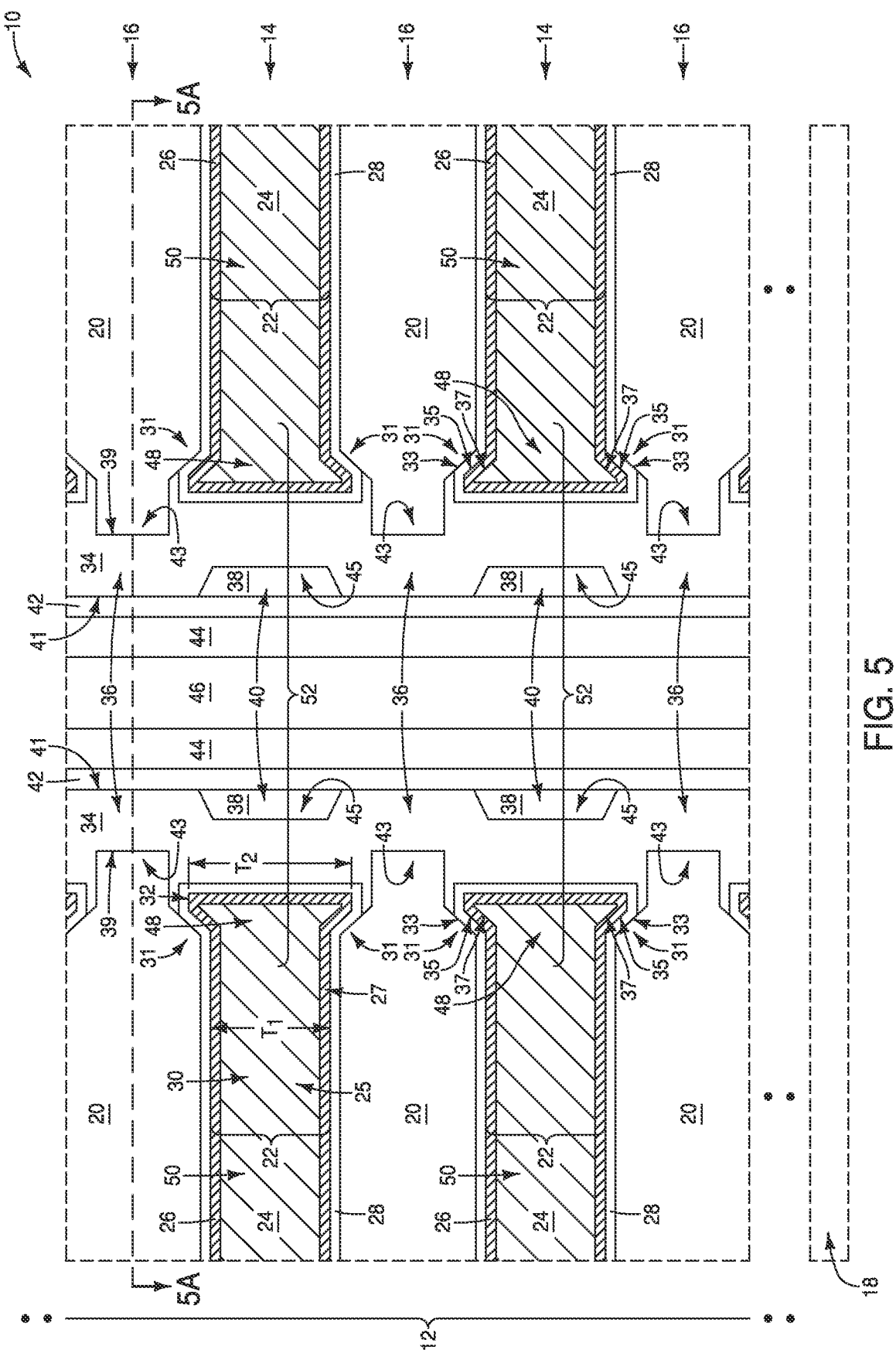
FIG. 5 is a diagrammatic cross-sectional side view of an integrated assembly showing a region of an example memory device.

Referring to FIG. 5, a construction (i.e., assembly, architecture, etc.) 10 includes a vertical stack 12 of alternating first and second levels 14 and 16. The first levels 14 are conductive levels, and the second levels 16 are insulative levels.

The conductive levels 14 are memory cell levels (also referred to herein as wordline levels or as routing/control gate levels) of a NAND configuration. The NAND configuration includes strings of memory cells (i.e., NAND strings), with the number of memory cells in the strings being determined by the number of vertically-stacked levels 14. The NAND strings may comprise any suitable number of memory cell levels. For instance, the NAND strings may have 8 memory cell levels, 16 memory cell levels, 32 memory cell levels, 64 memory cell levels, 512 memory cell levels, 1024 memory cell levels, etc. The vertical stack 12 is indicated to extend vertically beyond the illustrated region to show that there may be more vertically-stacked levels than those specifically illustrated in the diagram of FIG. 5.

The stack 12 is shown to be supported over a base 18. The base 18 may comprise semiconductor material; and may, for example, comprise, consist essentially of, or consist of monocrystalline silicon. The base 18 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 18 may correspond to a semiconductor substrate containing one or more materials associated with integrated circuit fabrication. Such materials may include, for example, one or more of refractory metal materials, barrier materials, diffusion materials, insulator materials, etc.

A gap is provided between the stack 12 and the base 18 to indicate that other components and materials may be provided between the stack 12 and the base 18. Such other components and materials may comprise additional levels of the stack, a source line level, source-side select gates (SGSs), etc.

The insulative levels 16 comprise insulative material 20. The insulative material 20 may comprise any suitable composition(s); and in some embodiments may comprise, consist essentially of, or consist of silicon dioxide.

The conductive levels 14 comprise conductive regions 22. The conductive regions include an inner conductive material 24 and an outer conductive material 26. The inner conductive material 24 may be considered to be configured as a conductive core 25, and the outer conductive material 26 may be considered to be configured as an outer conductive layer (liner) 27 which extends along an outer periphery of the conductive core.

The conductive materials 24 and 26 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). The conductive materials 24 and 26 are compositionally different from one another. In some embodiments the core material 24 may comprise one or more metals (e.g., may comprise tungsten), and the outer conductive material 26 may comprise one or more metal nitrides (e.g., may comprise titanium nitride). In some embodiments, the material 26 may be referred to as a conductive liner material, and the conductive material 24 may be referred to as a conductive core material.

Dielectric material 28 is along the outer conductive material 26. The dielectric material 28 may be dielectric barrier material, and may comprise any suitable composition(s). In some embodiments, the dielectric material 28 comprises high-k material, with the term "high-k" meaning a dielectric constant greater than that of silicon dioxide. In some embodiments, the dielectric material 28 may comprise, consist essentially of, or consist of one or more of AlO, HfO, HfSiO, ZrO and ZrSiO; where the chemical formulas indicate primary constituents rather than specific stoichiometries.

The conductive levels (wordline levels) 14 have first regions 30 having a first vertical thickness $T_1$, and have second regions (terminal regions) 32 having a second vertical thickness $T_2$ which is greater than the first vertical thickness. In some embodiments, the second vertical thickness $T_2$ is greater than the first vertical thickness $T_1$ by an amount within a range of from about 10% to about 70%. In the illustrated embodiment, the first regions 30 are approximately vertically centered relative to the second regions 32.

The conductive levels 14 have flared transition regions (tapered transition regions) 31 connecting the first regions 30 to the second regions 32 (i.e., between the first and second regions 30 and 32). In the illustrated embodiment, the materials 24, 26 and 28 all have surfaces extending along the tapers within the flared transition regions. Specifically, the material 28 has outer peripheral surfaces 33 along the tapers of the flared transition regions 31, the material 26 has outer peripheral surfaces 35 along the tapers of the flared transition regions 31, and the material 24 has outer peripheral surfaces 37 along the tapers of the flared transition regions 31.

Charge-blocking material 34 is along the terminal regions 32. The charge-blocking material 34 is configured as a continuous layer that extends vertically through the stack 12. The charge-blocking material 34 may comprise any suitable composition(s); and in some embodiments may comprise, consist essentially of, or consist of silicon oxynitride (SiON); where the chemical formula lists primary constituents rather than a specific stoichiometry.

The continuous layer of the charge-blocking material 34 has a first sidewall surface 39 adjacent the levels 14 and 16 of the stack 12, and has a second sidewall surface 41 in opposing relation to the first sidewall surface. The first sidewall surface 39 has an undulating topography (a first undulating topography) with first pocket regions 43 along the insulative levels 16, and the second sidewall surface 41 has an undulating topography (a second undulating topography) with second pocket regions 45 along the conductive levels 14.

The charge-blocking material 34 is adjacent to the dielectric barrier material 28, and is spaced from the conductive material 26 of the terminal regions 32 by the dielectric barrier material (high-k material) 28.

Charge-storage material 38 is adjacent to the charge-blocking material, and is arranged in vertically-stacked segments 40. The segments 40 are along the conductive levels 14, and are proximate the terminal regions 32 of such conductive levels. In the illustrated embodiment, the segments 40 of the charge-storage material are within the second pocket regions 45 defined by the undulating topography of the charge-blocking material 34.

The segments 40 (i.e., the segments of the charge-storage material 38) are vertically spaced from one another by gaps 36.

The charge-storage material 38 may comprise any suitable composition(s). In some embodiments the charge-storage material 38 may comprise charge-trapping materials; such as, for example, silicon nitride, silicon oxynitride, conductive nanodots, etc. For instance, in some embodiments the charge-storage material 38 may comprise, consist essentially of, or consist of silicon nitride.

Dielectric material (i.e., tunneling material, gate dielectric material) 42 is adjacent to the charge-storage material 38. The dielectric material 42 may comprise any suitable composition(s). In some embodiments, the dielectric material 42 may comprise, for example, one or more of silicon dioxide, silicon nitride, silicon oxynitride, aluminum oxide, hafnium oxide, zirconium oxide, etc. The dielectric material 42 may be bandgap-engineered to achieve desired electrical properties; and accordingly may comprise a combination of two or more different materials.

Channel material 44 is adjacent to the dielectric material 42, and extends vertically along the stack 12. The channel material 44 comprises semiconductor material; and may comprise any suitable composition or combination of compositions. For instance, the channel material 44 may comprise one or more of silicon, germanium, III/V semiconductor materials (e.g., gallium phosphide), semiconductor oxides, etc.; with the term III/V semiconductor material referring to semiconductor materials comprising elements selected from groups III and V of the periodic table (with groups III and V being old nomenclature, and now being referred to as groups 13 and 15). In some embodiments, the channel material 44 may comprise, consist essentially of, or consist of silicon.

Insulative material 46 is adjacent to the channel material 44. The insulative material 46 may comprise any suitable composition(s); and in some embodiments may comprise, consist essentially of, or consist of silicon dioxide.

Figure 5A:
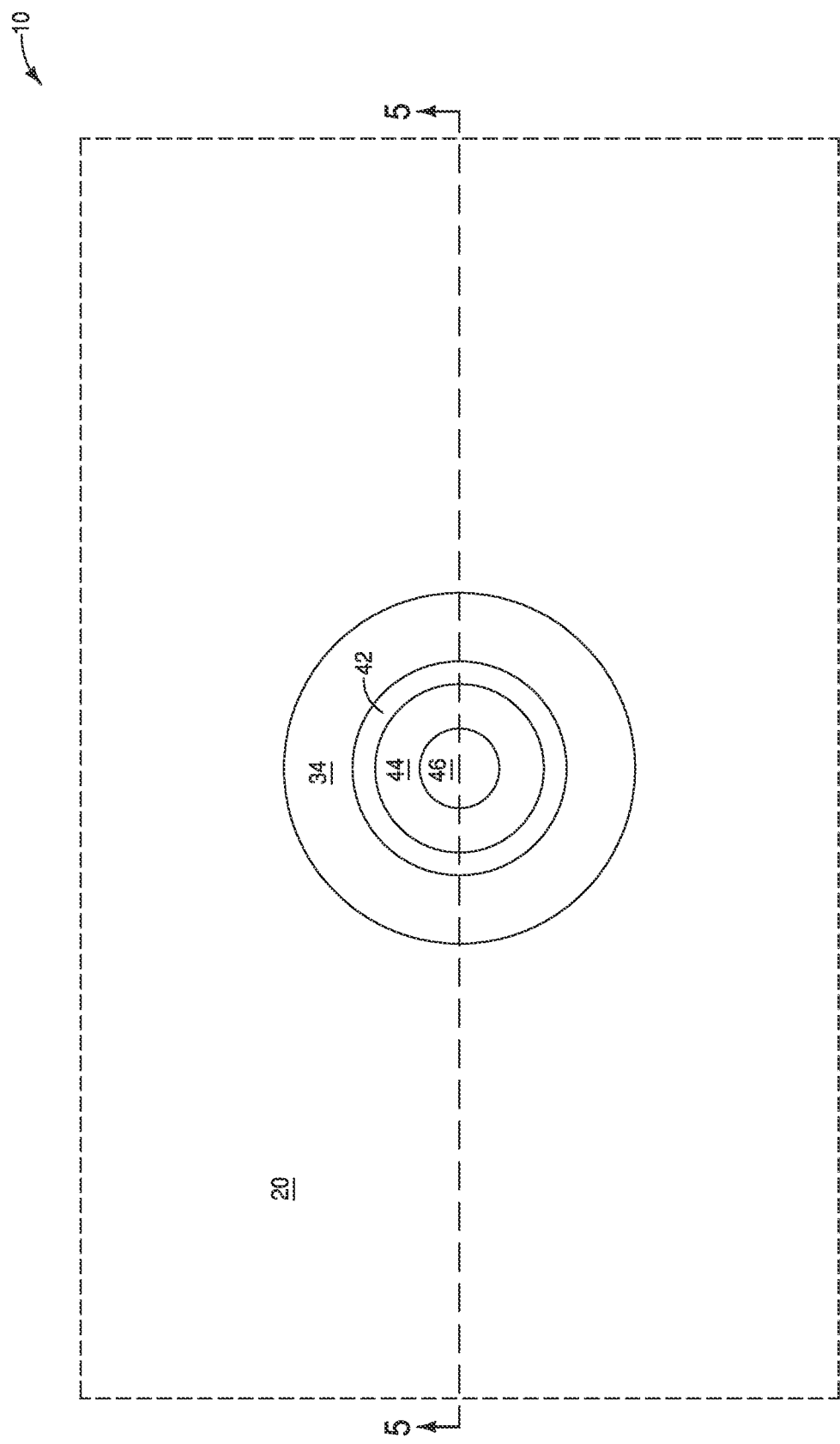
FIG. 5A is a diagrammatic cross-sectional top-down view of a portion of the integrated assembly of FIG. 5, and is along the line 5A-5A of FIG. 5.

FIG. 5A shows a top-down view of a region of the assembly 10, and shows that the channel material 44 may be configured as an annular ring surrounding the insulative material 46. The illustrated configuration of the channel material may be considered to comprise a hollow channel configuration, in that the insulative material 46 is provided within a "hollow" in the annular ring-shaped channel configuration. In other embodiments (not shown), the channel material may be configured as a solid pillar configuration.

Referring again to FIG. 5, the conductive levels 14 may be considered to comprise control gate regions 48 proximate the channel material 44, and to comprise wordline (routing) regions 50 adjacent the control gate regions. In the illustrated embodiment, the control gate regions 48 include the terminal regions 32.

The control gate regions 48, dielectric barrier material 28, charge-blocking material 34, charge-storage material 38, gate-dielectric material 42 and channel material 44 are incorporated into memory cells 52 (e.g., NAND memory cells analogous to those described above with reference to FIGS. 1-4). The illustrated memory cells 52 form a portion of a vertically-extending string of memory cells. Such string may be representative of a large number of substantially NAND strings formed during fabrication of a NAND memory assembly (with the term "substantially identical" meaning identical to within reasonable tolerances of fabrication and measurement).

The assembly 10 of FIG. 5 may be considered to correspond to an example memory device, with such memory device including the memory cells 52. The routing regions 50 may electrically couple the control gates 48 of the memory cells with other circuitry (e.g., Row Decoder circuitry of the type described above with reference to FIG. 1).

Notably, the channel material 44 is "flat" (i.e., is substantially vertically of continuous thickness, and is substantially vertically straight), as opposed to being undulating, in the configuration of FIG. 5. The flat channel material may positively impact string current as compared to non-flat configurations of some conventional designs. In some embodiments, the configuration of the channel material 44 may be referred to as a "flat configuration".

In operation, the charge-storage material 38 may be configured to store information in the memory cells 52. The value (with the term "value" representing one bit or multiple bits) of information stored in an individual memory cell may be based on the amount of charge (e.g., the number of electrons) stored in a charge-storage region of the memory cell. The amount of charge within an individual charge-storage region may be controlled (e.g., increased or decreased), at least in part, based on the value of voltage applied to an associated gate 48, and/or based on the value of voltage applied to the channel material 44.

The tunneling material 42 forms tunneling regions of the memory cells 52. Such tunneling regions may be configured to allow desired migration (e.g., transportation) of charge (e.g., electrons) between the charge-storage material 38 and the channel material 44. The tunneling regions may be configured (i.e., engineered) to achieve a selected criterion, such as, for example, but not limited to, an equivalent oxide thickness (EOT). The EOT quantifies the electrical properties of the tunneling regions (e.g., capacitance) in terms of a representative physical thickness. For example, EOT may be defined as the thickness of a theoretical silicon dioxide layer that would be required to have the same capacitance density as a given dielectric, ignoring leakage current and reliability considerations.

The charge-blocking material 34 is adjacent to the charge-storage material 38, and may provide a mechanism to block charge from flowing from the charge-storage material 38 to the associated gates 48.

The dielectric-barrier material 28 is provided between the charge-blocking material 34 and the associated gates 48, and may be utilized to inhibit back-tunneling of charge carriers from the gates 48 toward the charge-storage material 38. In some embodiments, the dielectric-barrier material 28 may be considered to form dielectric-barrier regions within the memory cells 52.

The embodiment of FIG. 5 has insulative material 20 throughout the insulative levels 14. In other embodiments, there may be voids within the insulative levels.

The example memory device 10 of FIG. 5 may be formed with any suitable processing. Example processing is described with reference to FIGS. 6-19.

Figure 6:
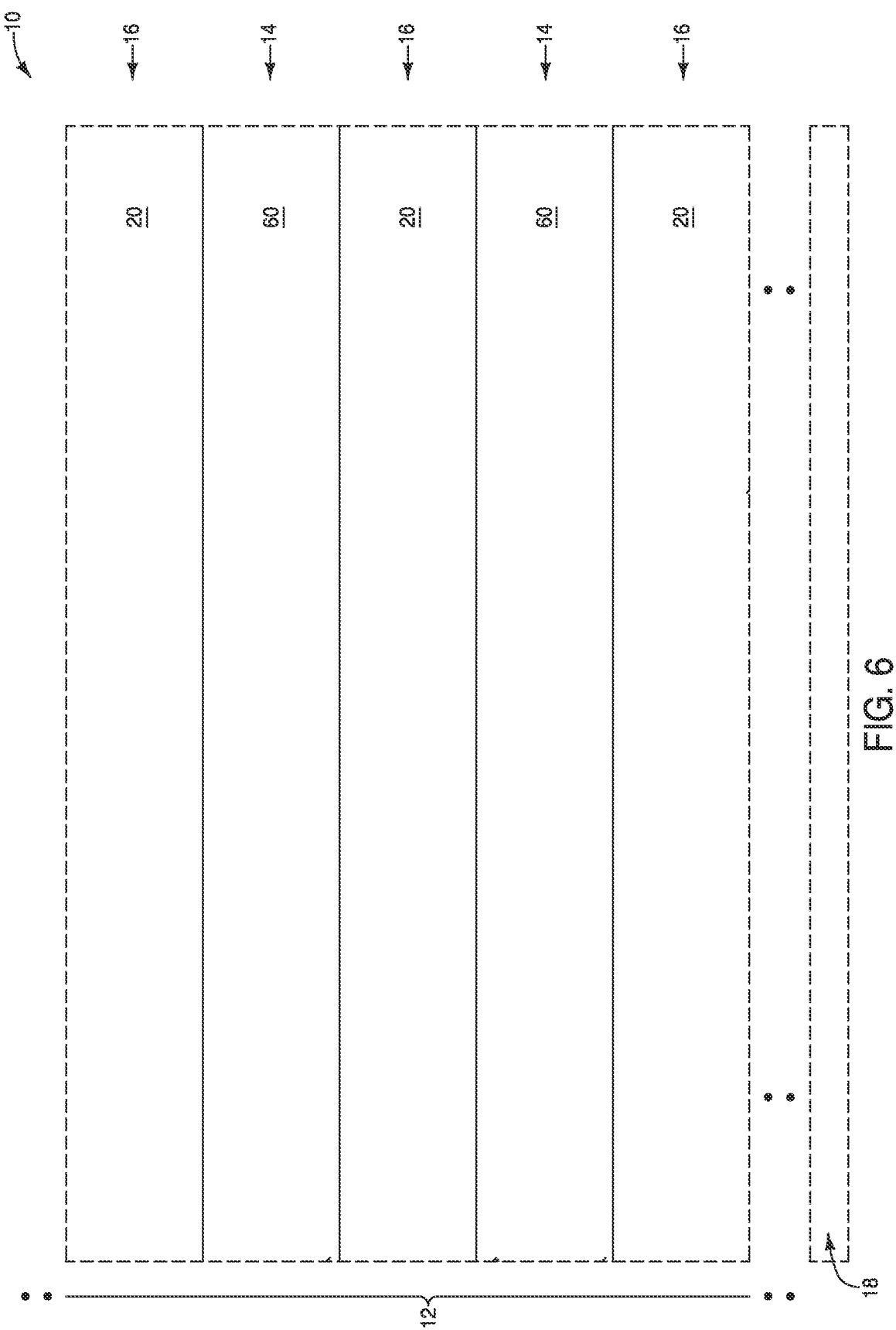
FIGS. 6-19 are diagrammatic cross-sectional side views of a region of an integrated assembly shown at example sequential process stages of an example method for fabricating an example memory device.

Referring to FIG. 6, a construction (integrated assembly, integrated structure) 10 includes a vertical stack 12 of alternating first and second levels 14 and 16. The first levels 14 comprise a first material 60, and the second levels 16 comprise a second material 20 (the same material 20 described above with the reference to FIG. 5). The first and second materials may comprise any suitable compositions, and are of different compositions relative to one another. In some embodiments, the first material 60 may comprise, consist essentially of, or consist of silicon nitride; and the second material 20 may comprise, consist essentially of, or consist of silicon dioxide. The levels 14 and 16 may be of any suitable thicknesses; and may be the same thickness as one another, or may be different thicknesses relative to one another. In some embodiments, the levels 14 and 16 may have vertical thicknesses within a range of from about 10 nanometers (nm) to about 400 nm. In some embodiments, the levels 14 and 16 may have thicknesses within a range of from about 10 nm to about 50 nm.

The stack 12 is shown to be supported over the base 18.

Figure 7:
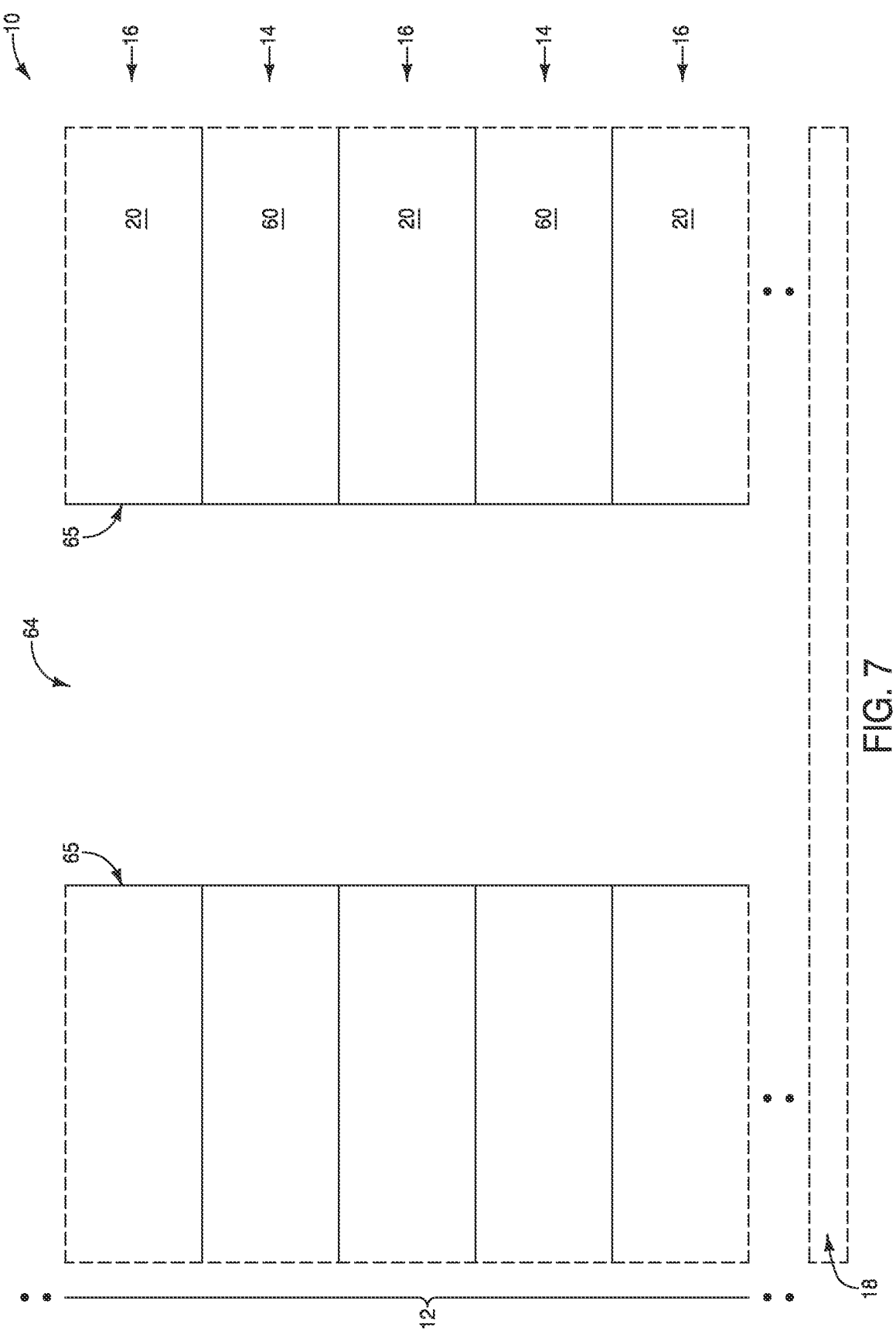

Referring to FIG. 7, an opening 64 is formed to extend through the stack 12. The opening 64 has sidewalls 65 extending along the first and second materials 60 and 20. The opening 64 may have a closed shape (circular, elliptical, polygonal, etc.) when viewed from above, and the sidewalls 65 shown in the cross-section of FIG. 6 may be part of a single continuous sidewall that extends around the closed shape of the opening 64. The opening 64 may be representative of a large number of substantially identical openings formed at the process stage of FIG. 6 and utilized for fabricating memory cells of a memory array (e.g., a NAND architecture); where the term "substantially identical" means identical to within reasonable tolerances of fabrication and measurement.

Figure 8:
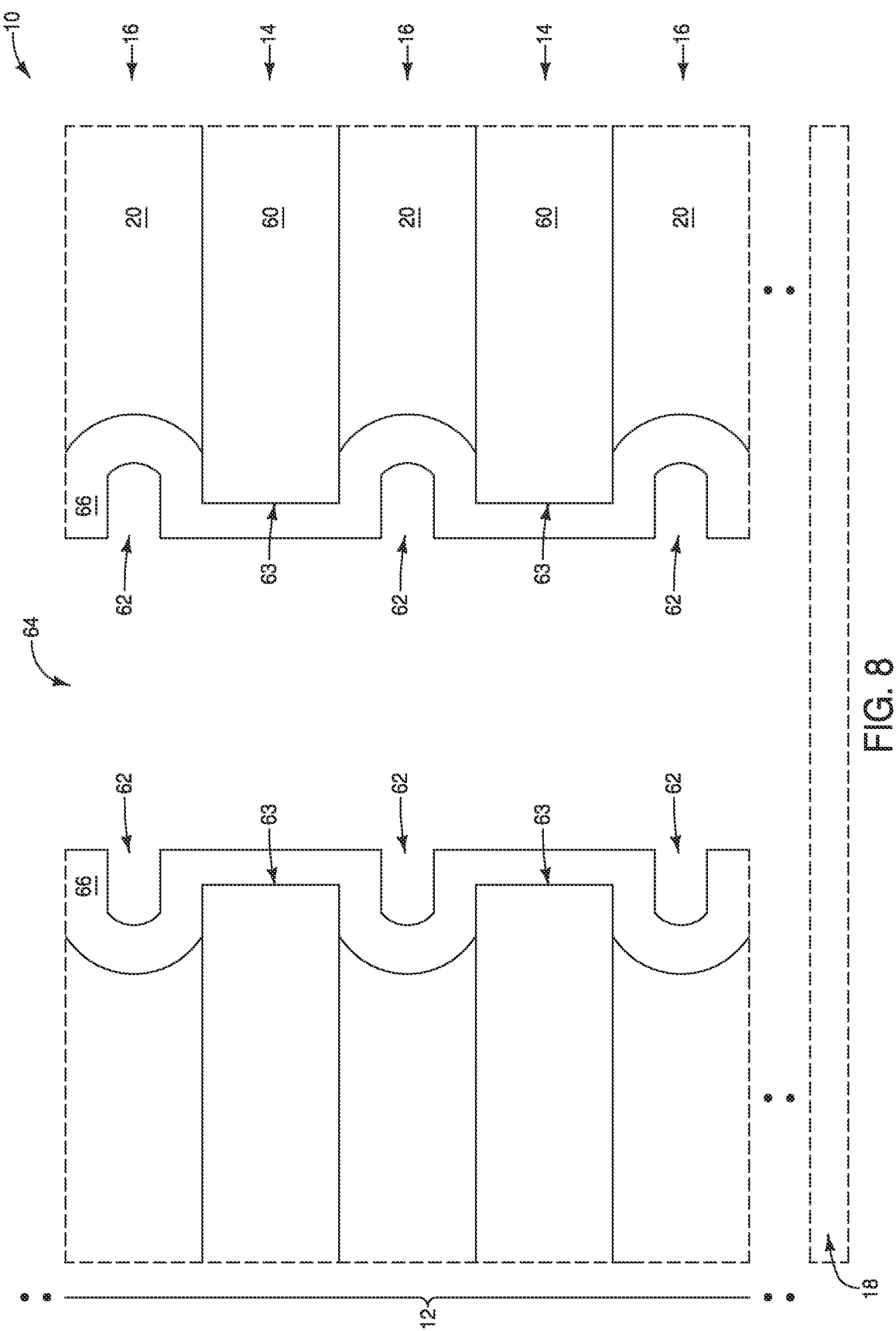

Referring to FIG. 8, the second levels 16 are recessed relative to the first levels 14 to form cavities 62. The second levels 16 may be recessed by any suitable amount, and in some embodiments may be recessed to an amount within a range of from about 3 nm to about 25 nm. The first levels 14 have projecting terminal ends 63 which extend beyond the recessed second levels 16. The cavities 62 are along the recessed second levels 16, and are vertically between the projecting terminal ends 63.

A third material 66 is formed to extend around the projecting terminal ends 63 and within the cavities 62. The third material 66 narrows the cavities 62. The third material 66 may comprise any suitable composition(s); and in some embodiments may comprise, consist essentially of, or consist of silicon dioxide. The third material 66 may comprise any suitable thickness, and in some embodiments may have a thickness within a range of from about 3 nm to about 25 nm. The third material is deposited conformally along the levels 14 and 16, and may deposited with any suitable methodology (e.g., atomic layer deposition, chemical vapor deposition, etc.,).

Figure 9:
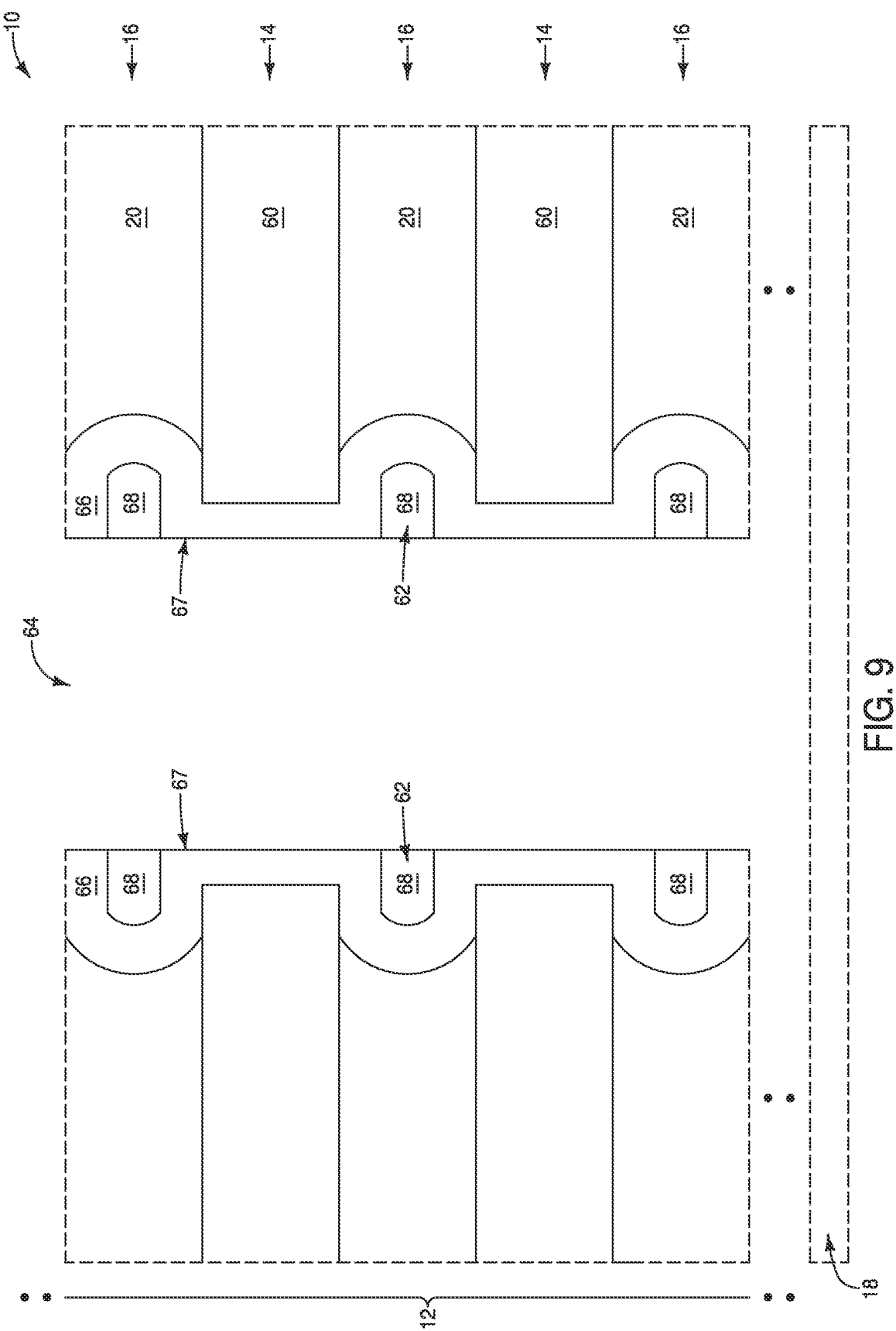

Referring to FIG. 9, a fourth material 68 is formed within the narrowed cavities 62. The fourth material may comprise any suitable composition(s); and in some embodiments may comprise, consist essentially of, or consist of silicon (e.g., one or both of polycrystalline silicon and amorphous silicon).

The fourth material 48 may be deposited and then etched so that the fourth material 48 and the first material 66 together form a substantially flat vertical surface 67 along the interior of the opening 64.

Figure 10:
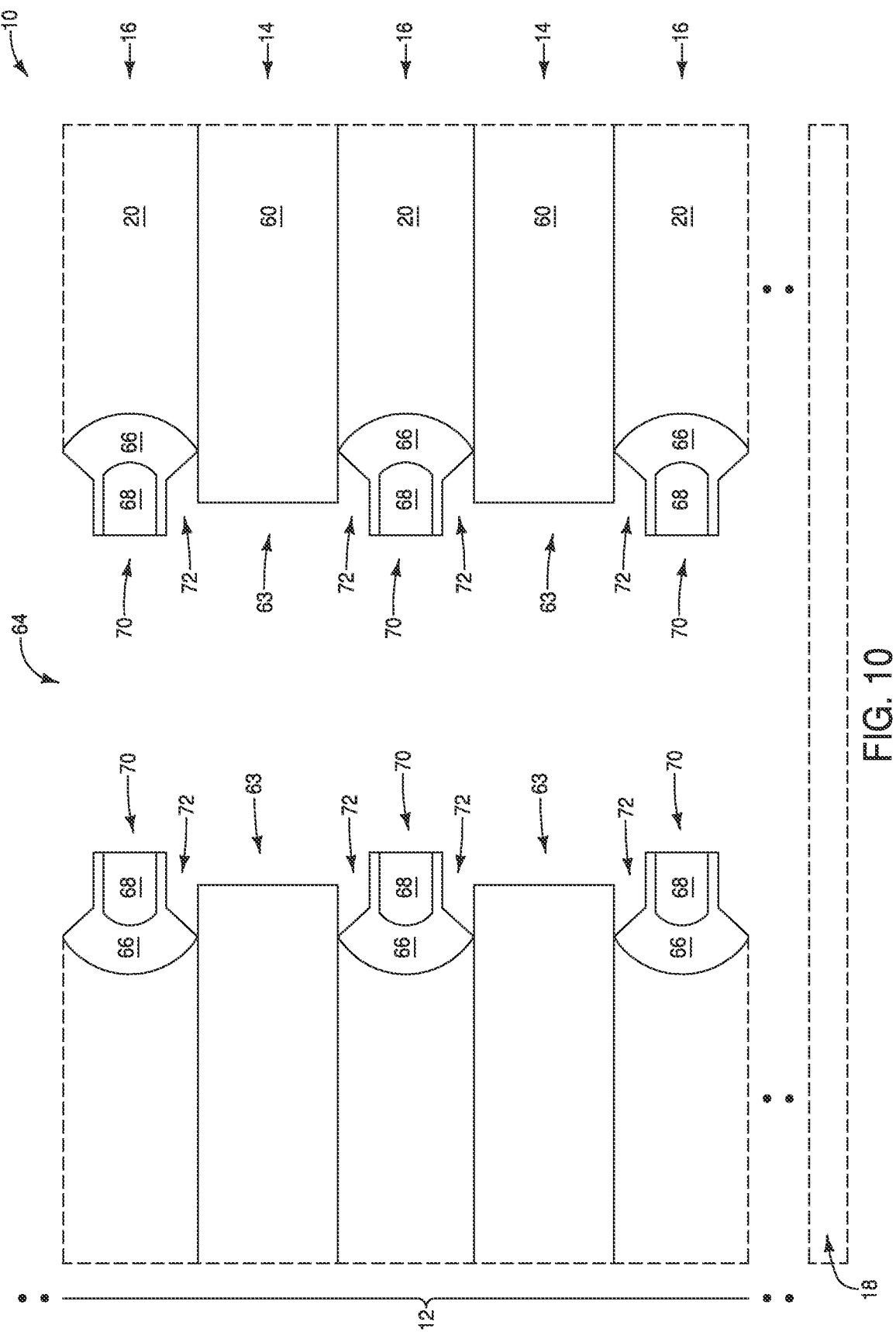

Referring to FIG. 10, regions of the third material 66 are removed to expose the projecting terminal ends 63 of the first levels 14, and to leave projecting structures 70 along the second levels 16. The projecting structures 70 are vertically spaced from the projecting terminal ends 63 by intervening gaps 72.

Figure 11:
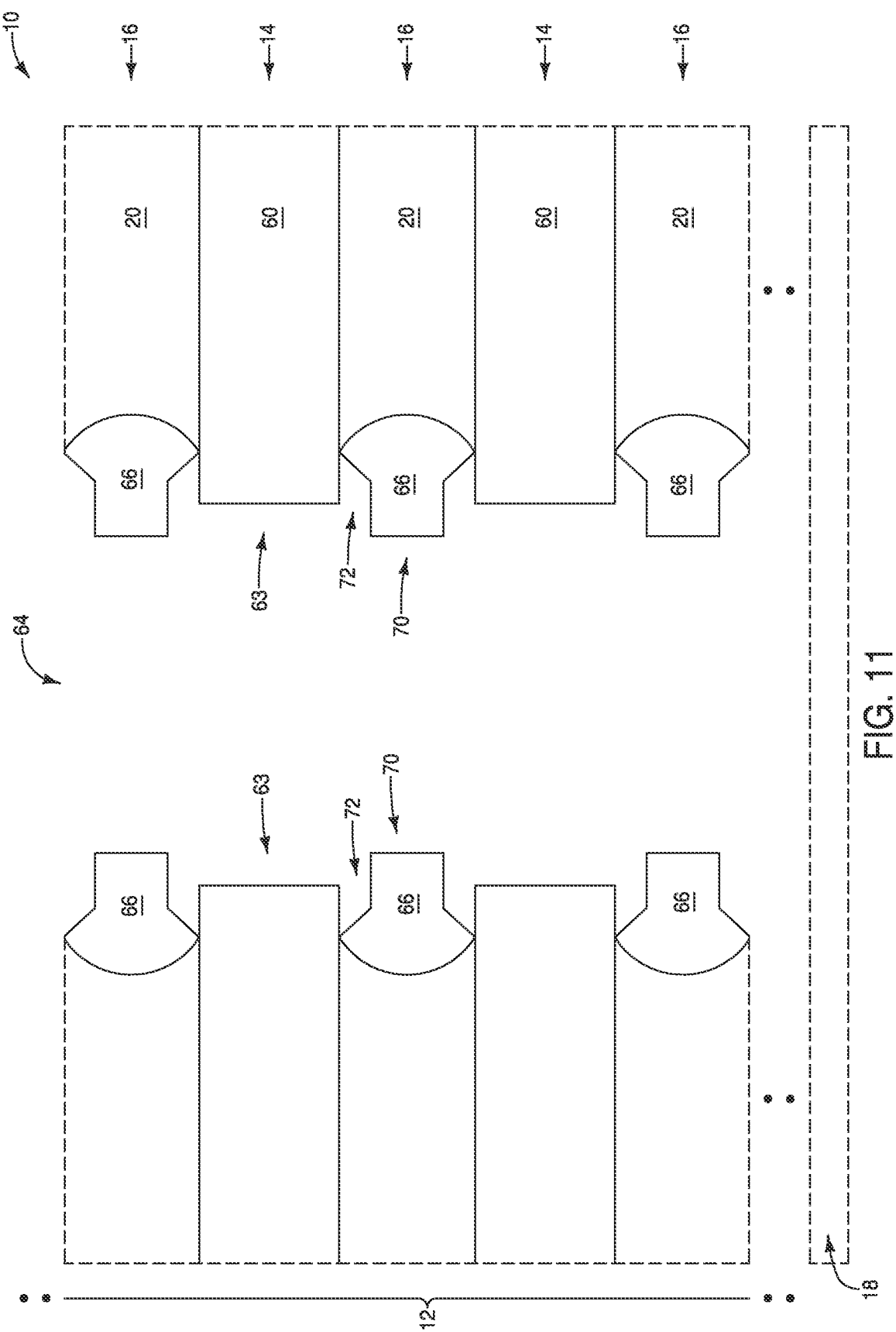

Referring to FIG. 11, the fourth material 68 (FIG. 10) is oxidized. In the illustrated embodiment, the fourth material 68 (FIG. 10) comprises silicon, and the oxidation converts it to silicon dioxide which merges with the silicon dioxide of the third material 66. Accordingly, the projecting structures 70 may consist essentially of, or consist of, silicon dioxide 66 at the processing stage of FIG. 11.

Figure 12:
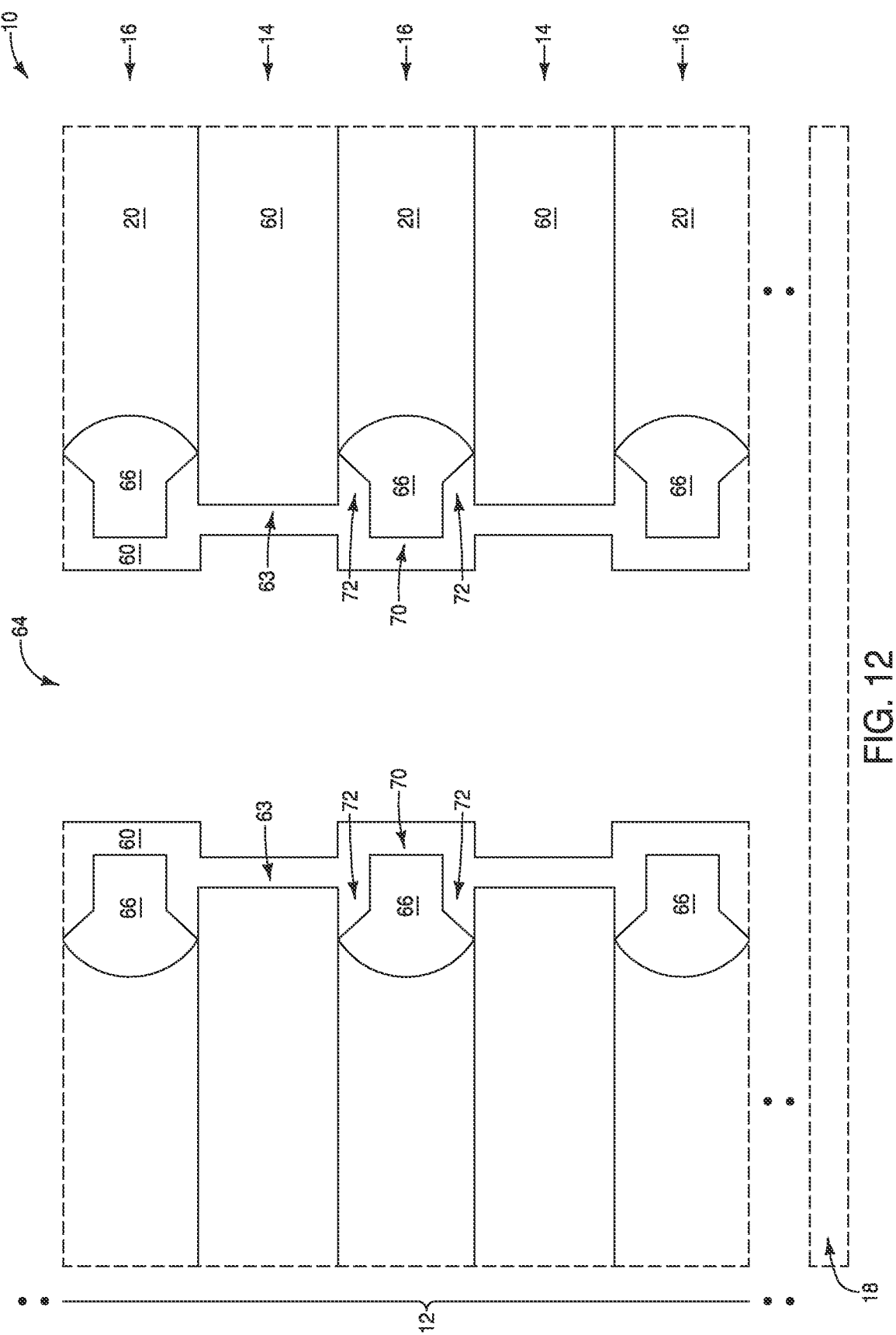

Referring to FIG. 12, additional first material 60 is formed to extend around the projecting terminal ends 63, around the projecting structures 70, and within the intervening gaps 72. The additional first material 60 would merge with the material 60 of the first levels 14, but is shown distinct from the material 60 of the first levels to assist the reader in visualizing the additional first material 60.

Figure 13:
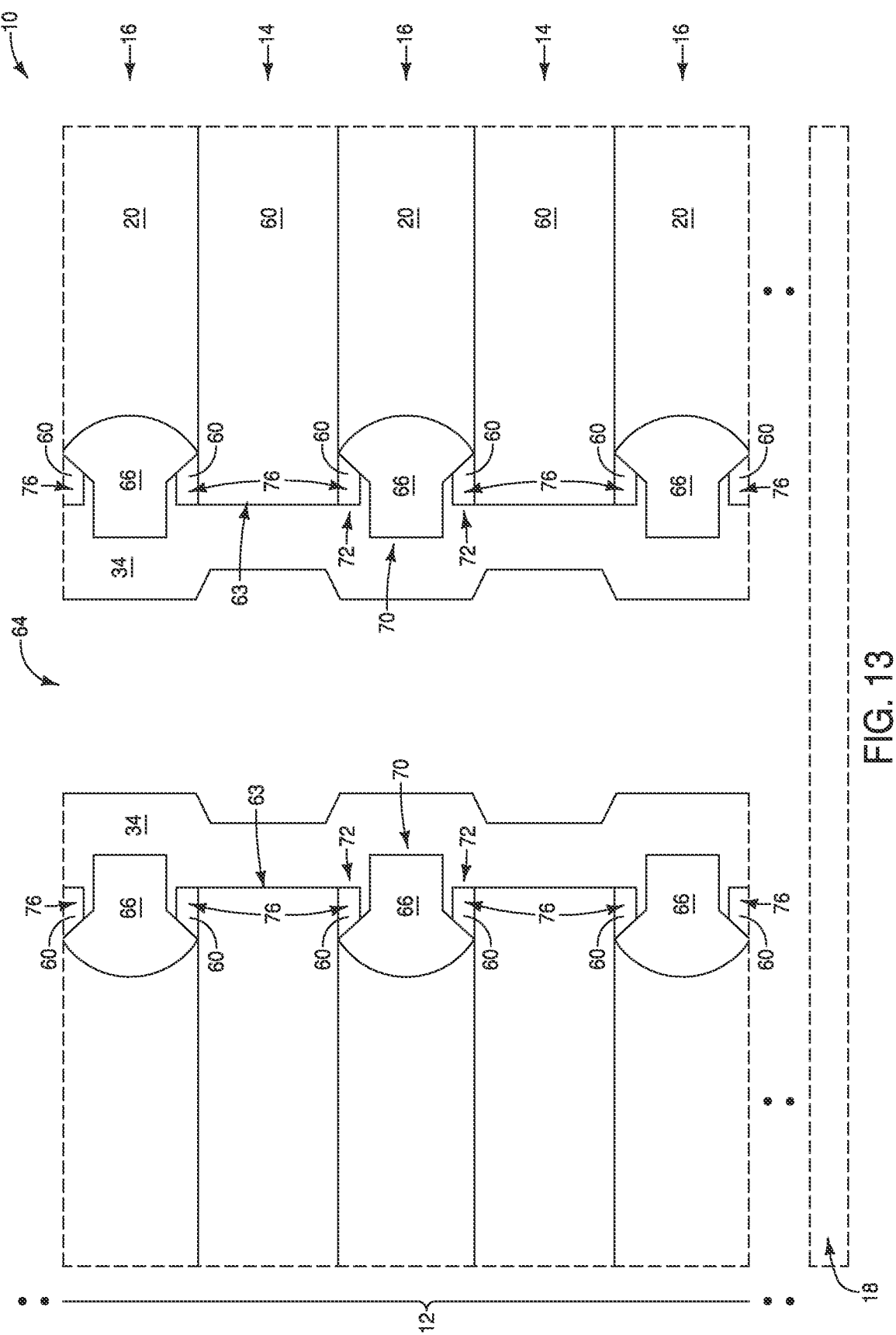

Referring to FIG. 13, most of the additional first material 60 is converted to charge-blocking material 34. Such conversion may comprise oxidation of the silicon nitride of material 60 to form the silicon oxynitride of the charge-blocking material 34. The oxidation may utilize any suitable oxidant(s); including, for example, $H_2O$, $O_2$, $O_3$, $H_2O_2$, etc. Notably, regions of the additional first material 60 deep within the intervening gaps 72 are not converted to the charge-blocking material 34 due to geometrical constraints (and/or other reasons) that preclude oxidant from reaching such regions of the additional first material 60. The regions of material 60 remaining within the intervening gaps 72 may be considered to be non-converted regions 76.

Figure 14:
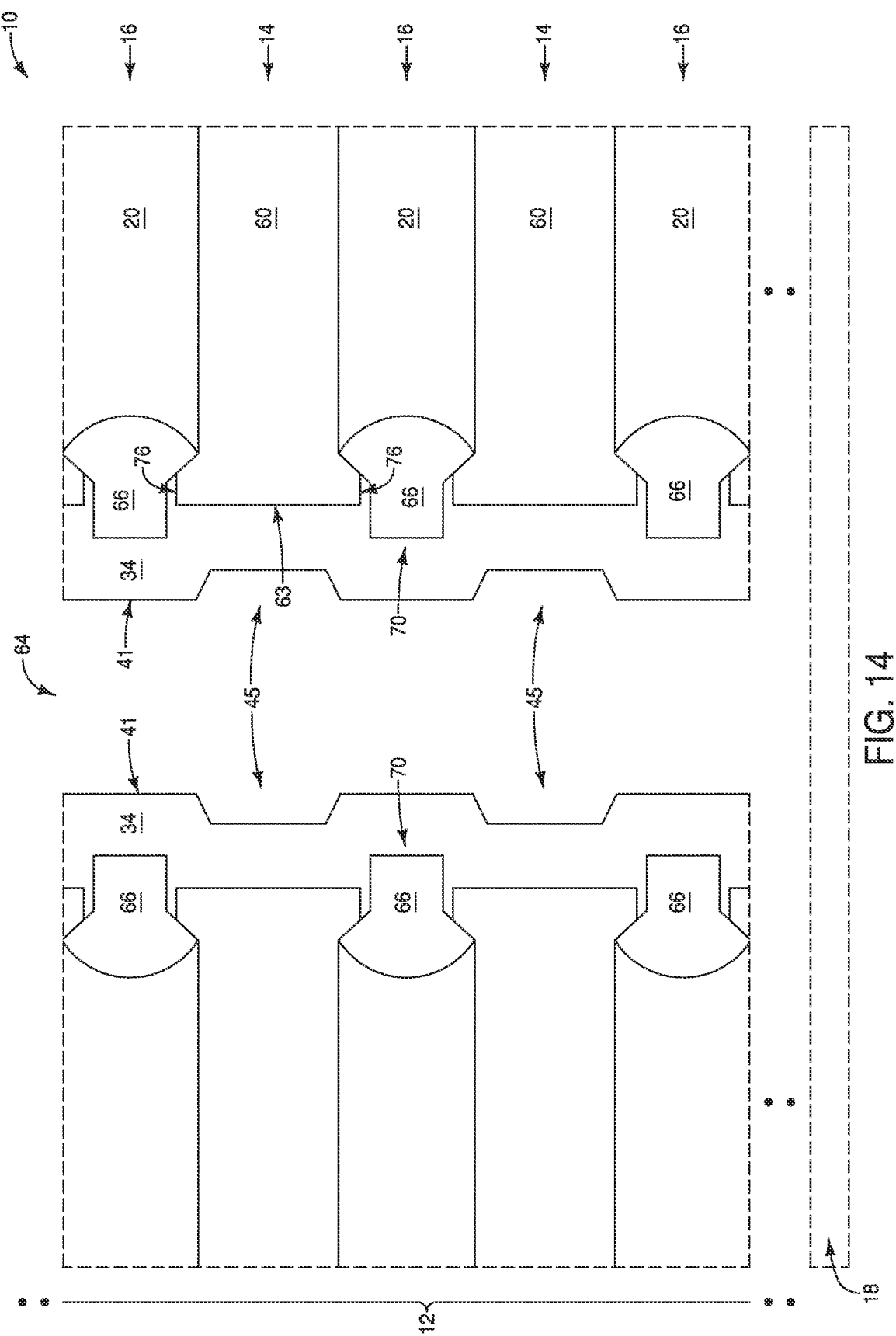

The non-converted regions 76 are directly against surfaces of the projecting terminal ends 63 of the first levels 14 and comprise the same material (60) as the first levels 14. FIG. 14 shows the same processing stage as FIG. 13, but shows the non-converted regions 76 merging with the projecting terminal ends 63.

The charge-blocking material 34 extends vertically through the stack 12, and has an edge 41 with the undulating topography that defines the pocket regions (pockets) 45 along the first levels 14. In some embodiments, the edge 41 of the charge-blocking material 34 may be referred to as an inner edge, as it is along an interior of the opening 64.

Figure 15:
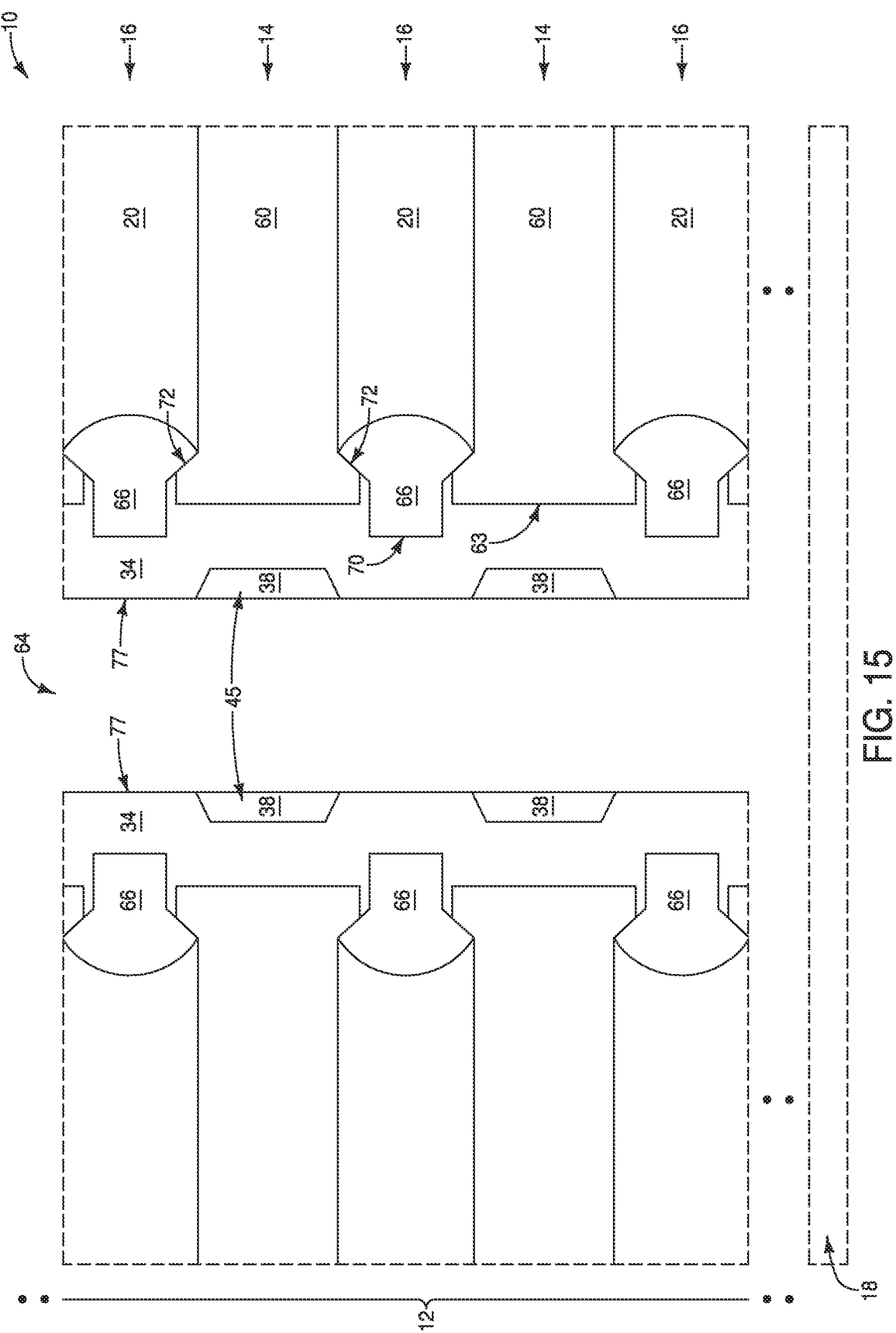

Referring to FIG. 15, the charge-storage material 38 is formed within the pockets 45. The charge-storage material 38 may be deposited and then etched so that the charge-storage material 38 and the charge-blocking material 34 together form a substantially flat vertical surface 77 along the interior of the opening 64. The etch of the charge-storage material 38 may utilize any suitable conditions and etchant (s), and in some embodiments such etch may utilize phosphoric acid.

Figure 16:
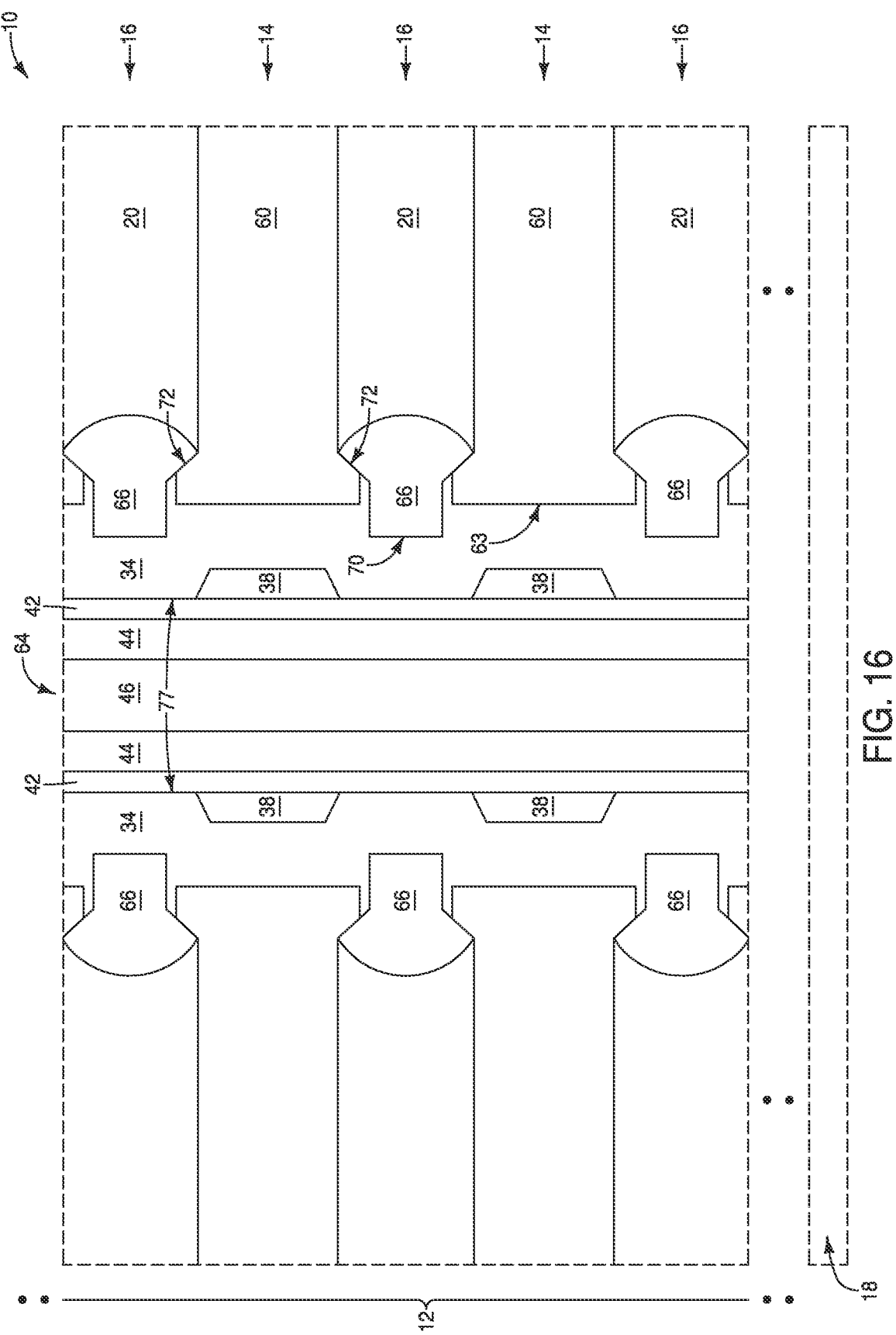

Referring to FIG. 16, the dielectric material 42 is formed along the substantially flat vertical surface 77, the channel material 44 is formed adjacent to the dielectric material 42, and the insulative material 46 is formed adjacent to the channel material 44.

Figure 17:
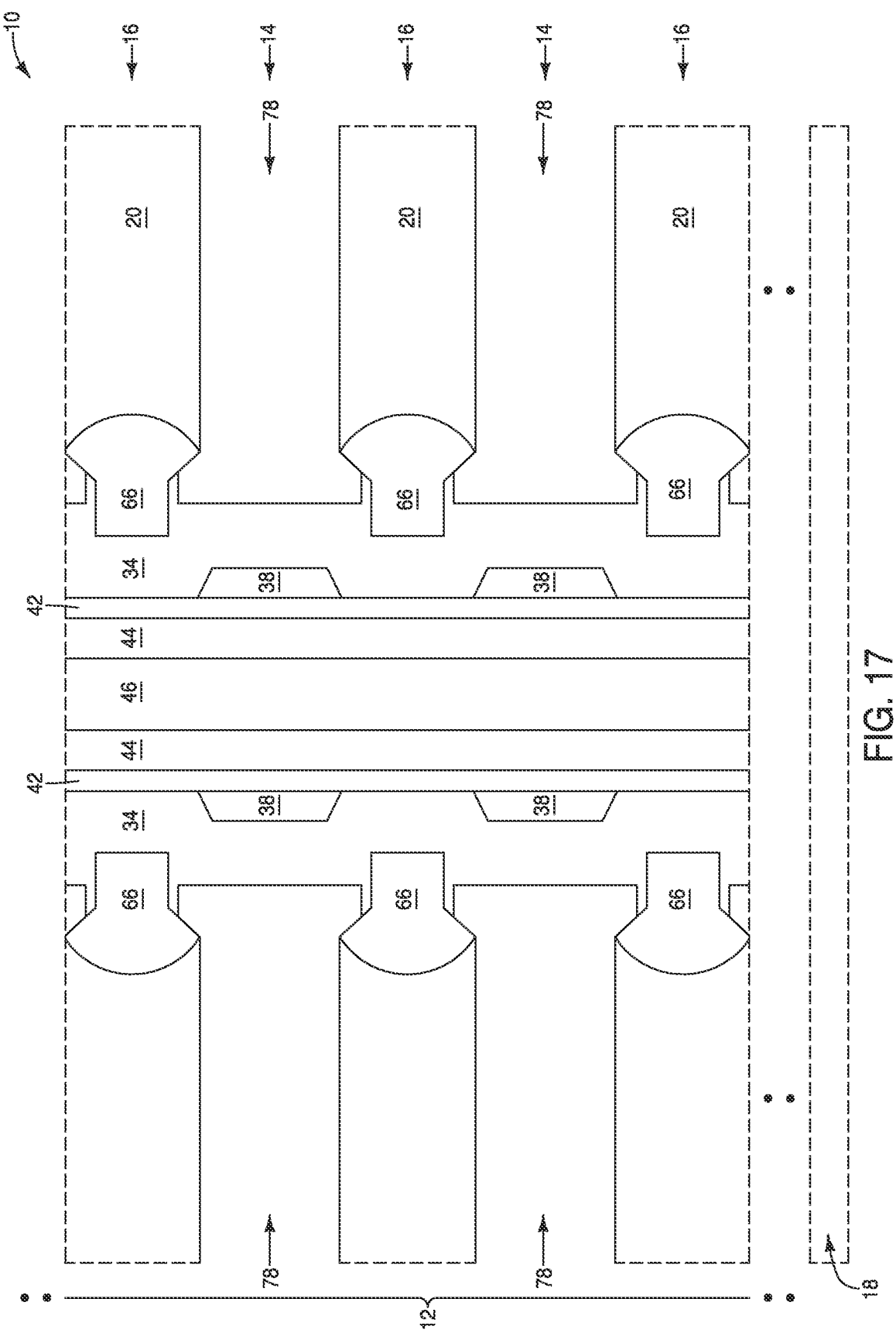

Referring to FIG. 17, the first material 60 (FIG. 16) is removed to leave voids 78 along the first levels 14. The first material 60 may be removed with any suitable conditions and etchant(s), and in some embodiments such removal may utilize phosphoric acid.

Figure 18:
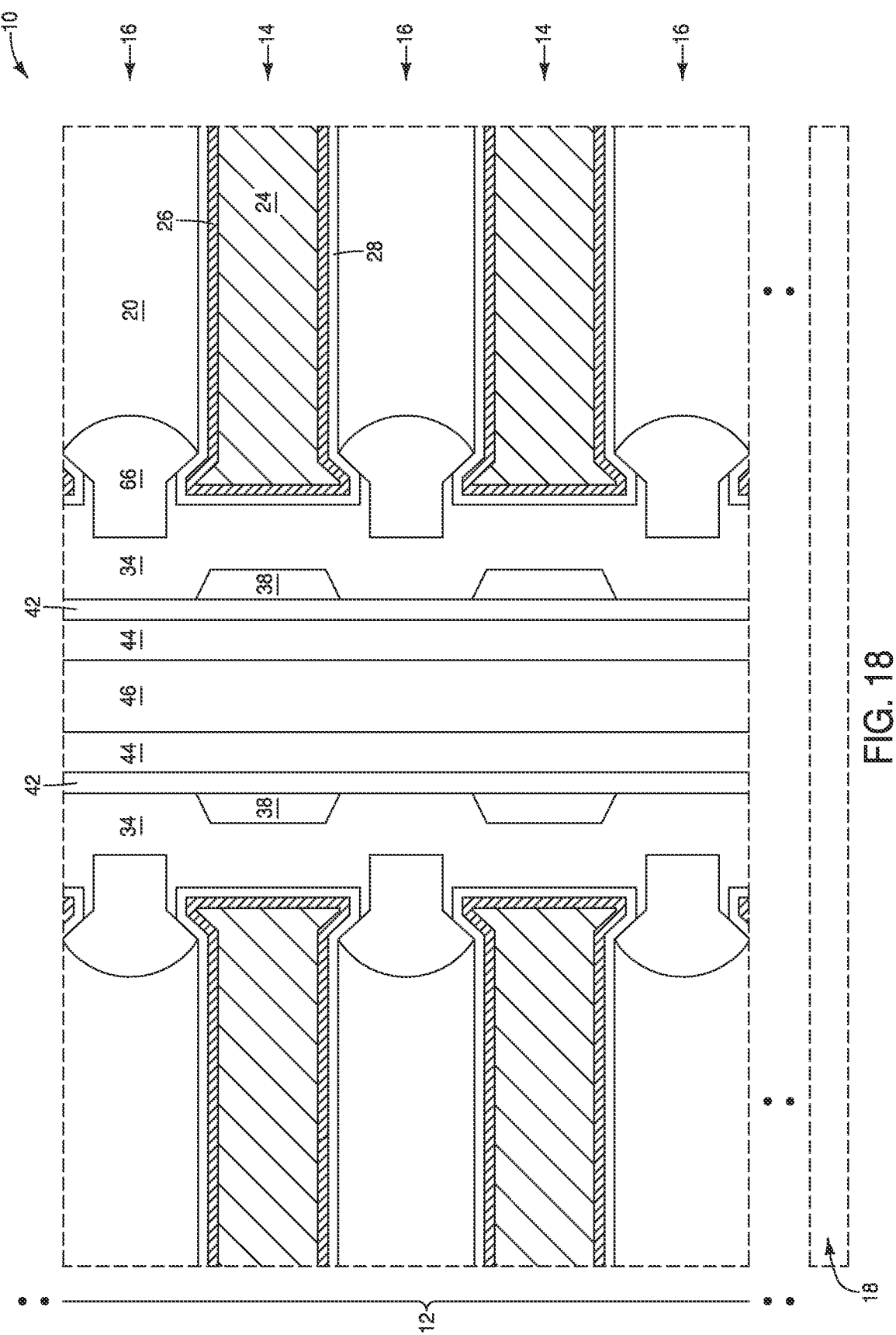

Referring to FIG. 18, the dielectric barrier material 28, conductive material 26 and conductive material 24 are formed within the voids 78 (FIG. 17). The material 28 may be provided to initially line the voids 78, then the material 26 may be provided to further line the voids, and finally the material 24 may be provided to fill the lined voids.

The first levels 16 of FIG. 18 are conductive levels analogous to those described above with reference to FIG. 5.

Figure 19:
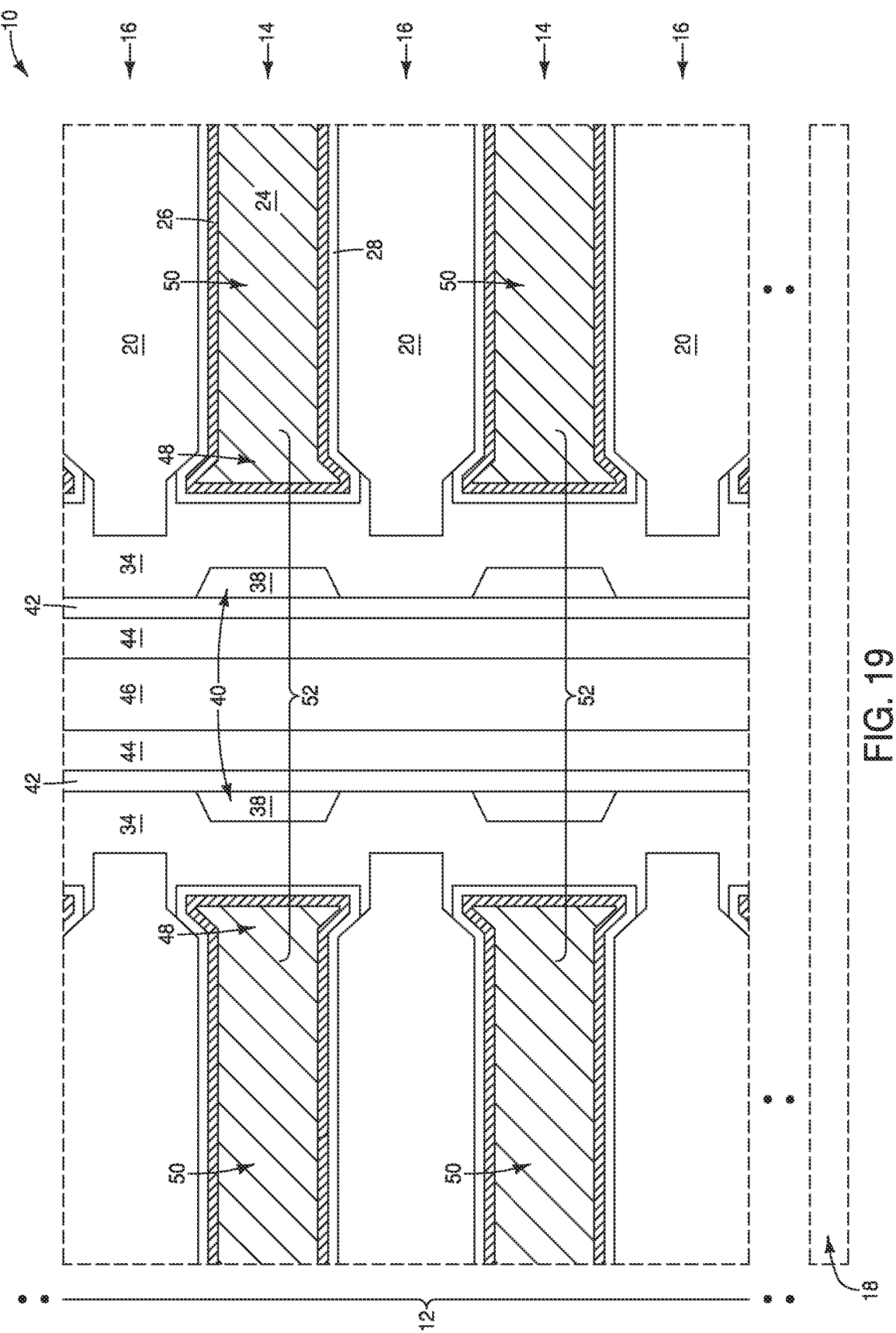

The materials 66 and 20 along the second levels 16 may comprise a same composition as one another (e.g., may both comprise silicon dioxide), and accordingly such materials may merge and may be represented to be a single material 20, as shown in FIG. 19. The construction 10 of FIG. 19 is identical to that described above with reference to FIG. 5, and accordingly may be considered to be a memory device comprising the vertically-stacked memory cells 52.

The embodiments described herein advantageously provide methodology which may be utilized to tailor gate lengths (i.e., the vertical thicknesses, $T_2$, of the terminal regions of the control gates 48), with such gate lengths being equal to or greater than the lengths of storage nodes (i.e., the segments 40 of the charge-storage material 38) within memory cells (i.e., the memory cells 52). Such may enable desired wide program/erase windows associated with the memory cells. Further, the routing regions (wordline regions) 50 may be kept relatively narrow (as compared to the control gates), which may alleviate undesired parasitic capacitance between vertically adjacent routing regions. In some embodiments, voids may be provided along the second levels 16 to further alleviate undesired parasitic capacitance between vertically adjacent routing regions 50.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated structure having a vertical stack of alternating insulative levels and conductive levels. The conductive levels have first regions of a first vertical thickness, have terminal regions of a second vertical thickness which is greater than the first vertical thickness, and have flared transition regions between the first regions and the terminal regions. Charge-blocking material is adjacent to the terminal regions. Charge-storage material is adjacent to the charge-blocking material and is arranged in vertically-stacked segments. The segments are along the conductive levels and are vertically spaced from one another by gaps. Dielectric material is adjacent to the charge-storage material. Channel material is adjacent to the dielectric material.

Some embodiments include a memory device having a vertical stack of alternating insulative levels and conductive levels. Memory cells are along the conductive levels. The conductive levels have control gate regions which include a first vertical thickness, have routing regions which include a second vertical thickness that is less than the first vertical thickness, and have tapered transition regions between the first vertical thickness and the second vertical thickness. Charge-blocking material is adjacent to the control gate regions. Charge-storage material is adjacent to the charge-blocking material. Dielectric material is adjacent to the charge-storage material. Channel material extends vertically along the vertical stack and is adjacent to the dielectric material. The memory cells include the control gate regions, and include regions of the charge-blocking material, the charge-storage material, the dielectric material and the channel material.

Some embodiments include a method of forming an integrated structure. A vertical stack of alternating first and second levels is formed. The first levels comprise first material and the second levels comprise second material. An opening is formed to extend through the stack. The second levels are recessed relative to the first levels. The first levels have projecting terminal ends which extend beyond the recessed second levels. Cavities are along the recessed second levels and are vertically between the projecting terminal ends. Third material is formed to extend around the projecting terminal ends and within the cavities. The third material narrows the cavities. Fourth material is formed within the narrowed cavities. Regions of the third material are removed to leave projecting structures along the second levels. The projecting structures comprise the fourth material. The projecting structures are vertically spaced from the projecting terminal ends by intervening gaps. Additional first material is formed to extend around the projecting terminal ends and around the projecting structures, and to extend into the intervening gaps. Most of the additional first material is converted to charge-blocking material. Regions of the additional first material within the intervening gaps are non-converted regions. The non-converted regions are directly adjacent surfaces of the projecting terminal ends. The charge-blocking material extends vertically through the stack and has an edge with an undulating topography which defines pockets along the first levels. Charge-storage material is formed within the pockets. The charge-storage material and the charge-blocking material together form a substantially flat surface. Dielectric material is formed along the substantially flat surface. Channel material is formed adjacent to the dielectric material. The first material of the first levels and the non-converted regions is removed to leave voids. Conductive material is formed within the voids.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming an integrated structure, comprising:
   forming a vertical stack of alternating first and second levels; the first levels comprising a first material, and the second levels comprising a second material;
   forming an opening to extend through the stack;
   recessing the second levels relative to the first levels to form recessed second levels; the first levels having projecting terminal ends extending beyond the recessed second levels; cavities being along the recessed second levels and vertically between the projecting terminal ends;
   forming a third material to extend around the projecting terminal ends and within the cavities, the third material narrowing the cavities;
   forming a fourth material within the narrowed cavities;
   removing regions of the third material to leave projecting structures along the second levels, the projecting structures comprising the fourth material; the projecting structures being vertically spaced from the projecting terminal ends by intervening gaps;
   forming an additional first material to extend around the projecting terminal ends and around the projecting structures, and to extend into the intervening gaps;
   converting most of the additional first material to a charge-blocking material, regions of the additional first material within the intervening gaps being non-converted regions; the non-converted regions being directly adjacent surfaces of the projecting terminal ends; the charge-blocking material extending vertically through the stack and having an edge with an undulating topography which defines pockets along the first levels;
   forming a charge-storage material within the pockets; the charge-storage material and the charge-blocking material together forming a substantially flat surface;
   forming a dielectric material along the substantially flat surface;
   forming a channel material adjacent the dielectric material;
   removing the first material of the first levels and the non-converted regions to leave voids; and
   forming a conductive material within the voids.

2. The method of claim 1 wherein the conductive material within the voids forms conductive levels; wherein the conductive levels have first regions of a first vertical thickness, and have second regions of a second vertical thickness which is greater than the first vertical thickness; and wherein the second regions are between the first regions and the charge-blocking material.

3. The method of claim 2 the conductive levels include flared transition regions between the first and second regions.

4. The method of claim 1 further comprising forming a high-k material within the voids to line the voids prior to forming the conductive material within the voids.

5. The method of claim 1 wherein the conductive material includes a conductive core material, and includes a conductive liner material which at least partially surrounds an outer periphery of the conductive core material.

6. The method of claim 5 wherein the conductive core material comprises tungsten, and wherein the conductive liner material comprises titanium nitride.

7. The method of claim 1 wherein the converting comprises oxidation of the additional first material.

8. The method of claim 7 wherein the first material comprises silicon nitride, and wherein the charge-blocking material comprises silicon oxynitride.

9. The method of claim 8 wherein the second material comprises silicon dioxide.

10. The method of claim 9 wherein the third material comprises silicon dioxide.

11. The method of claim 10 wherein the fourth material comprises silicon.

12. The method of claim 11 further comprising oxidizing the fourth material to convert the fourth material to silicon dioxide prior to removing the regions of the third material.

13. The method of claim 1 wherein the charge-storage material comprises a charge-trapping material.

14. The method of claim 1 wherein the charge-storage material comprises silicon nitride.

15. A method of forming an integrated structure, comprising:
   forming a vertical stack of alternating insulative levels and conductive levels; the conductive levels having first regions of a first vertical thickness, having terminal regions of a second vertical thickness which is greater than the first vertical thickness, and having flared transition regions between the first regions and the terminal regions;
   forming a charge-blocking material adjacent the terminal regions;
   forming a charge-storage material adjacent the charge-blocking material and arranged in vertically-stacked segments; the vertically-stacked segments being along the conductive levels and being vertically spaced from one another by gaps;
   forming a dielectric material adjacent the charge-storage material; and
   forming a channel material adjacent the dielectric material, the insulative levels comprising an insulative material within a unitary structure that extends over the first regions of the conductive levels, over the terminal regions and over a portion of the charge blocking material, the unitary structure comprising terminal regions having upper, lower and side edges that physically contact the charge blocking material.

16. The method of claim 15 wherein the conductive levels include a conductive liner material extending along an outer peripheral surface of a conductive core material.

17. The method of claim 16 wherein the conductive liner material comprises titanium nitride and the conductive core material comprises tungsten.

18. The method of claim 17 wherein the conductive liner material of an individual of the conductive levels has an outer peripheral surface which extends along a taper within a flared transition region associated with said individual of the conductive levels.

19. The method of claim 18 wherein the conductive core material of the individual of the conductive levels has an outer peripheral surface which also extends along the taper within the flared transition region associated with said individual of the conductive levels.

20. The method of claim 15 wherein the charge-blocking material is configured as a continuous layer that extends through the stack.

* * * * *